(12) United States Patent
Hsieh et al.

(10) Patent No.: US 8,999,736 B2
(45) Date of Patent: Apr. 7, 2015

(54) OPTOELECTRONIC SYSTEM

(75) Inventors: Min-Hsun Hsieh, Hsinchu (TW); Cheng-Nan Han, Hsinchu (TW); Steve Meng-Yuan Hong, Hsinchu (TW); Hsin-Mao Liu, Hsinchu (TW); Tsung-Xian Lee, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 306 days.

(21) Appl. No.: 12/840,848

(22) Filed: Jul. 21, 2010

(65) Prior Publication Data
US 2010/0283062 A1 Nov. 11, 2010

Related U.S. Application Data

(63) Continuation-in-part of application No. 11/160,588, filed on Jun. 29, 2005, now Pat. No. 7,928,455, which is a continuation-in-part of application No. 10/604,245, filed on Jul. 4, 2003, now Pat. No. 6,987,287.

(30) Foreign Application Priority Data

Jul. 21, 2009 (TW) .............................. 98124681 A
Dec. 30, 2009 (TW) .............................. 98146171 A

(51) Int. Cl.
*H01L 21/00* (2006.01)
*H01L 33/50* (2010.01)
(Continued)

(52) U.S. Cl.
CPC .......... *H01L 33/508* (2013.01); *H01L 21/6835* (2013.01); *H01L 24/24* (2013.01);
(Continued)

(58) Field of Classification Search
CPC ............ H01L 33/0079; H01L 2224/97; H01L 25/0753; H01L 33/44; H01L 33/08; H01L 24/97; H01L 2924/0665; H01L 25/167; H01L 21/568; H01L 33/56; H01L 27/1266; H01L 2224/96; H01L 33/52

USPC ........ 438/27, 28, 30, 26, 34, 42; 257/E21.54, 257/E21.545
See application file for complete search history.

(56) References Cited

U.S. PATENT DOCUMENTS 5,207,864 A 5/1993 Bhat et al.
5,376,580 A 12/1994 Kish et al.
(Continued)

FOREIGN PATENT DOCUMENTS

CN 1797728 A 7/2006
CN 101350386 A 1/2009
(Continued)

OTHER PUBLICATIONS

Chu et al., "Farbrication and Charactoristics of Freestanding GaN light emitting devices by Laser Lift-off Technique," Proceedings of Opto-Electronics and Communications Conference, Jul. 8, 2002, No. 87, Yokohama, Japan.
(Continued)

*Primary Examiner* — Wael Fahmy
*Assistant Examiner* — Sarah Salerno
(74) *Attorney, Agent, or Firm* — Muncy, Geissler, Olds & Lowe, P.C.

(57) ABSTRACT

A method of making an optoelectronic system in accordance with the present disclosure is disclosed. The method includes providing a temporary substrate; providing un-packaged optoelectronic elements having sidewalls, top surfaces, and bottom surfaces, at least one of the unpackaged optoelectronic elements having an electrode provided on a side of the bottom surfaces; attaching the bottom surfaces to the temporary substrate such that a trench is formed between two of the un-packaged optoelectronic elements; providing an adhesive material to fully fill the trench and cover the un-packaged optoelectronic elements such that the sidewalls and top surfaces of the un-packaged optoelectronic elements are fully enclosed by the adhesive material; providing a transparent substrate on the adhesive material; and removing the temporary substrate without removing all the adhesive material covering the optoelectronic elements.

19 Claims, 33 Drawing Sheets

(51) Int. Cl.
*H01L 21/683* (2006.01)
*H01L 23/00* (2006.01)
H01L 25/075 (2006.01)
H01L 33/00 (2010.01)
H01L 33/40 (2010.01)

(52) U.S. Cl.
CPC .............. *H01L 24/49* (2013.01); *H01L 24/82* (2013.01); *H01L 24/96* (2013.01); *H01L 24/45* (2013.01); *H01L 25/0753* (2013.01); *H01L 25/0756* (2013.01); *H01L 33/0079* (2013.01); *H01L 33/405* (2013.01); *H01L 2224/24137* (2013.01); *H01L 2224/45124* (2013.01); *H01L 2224/45144* (2013.01); *H01L 2224/48091* (2013.01); *H01L 2224/48137* (2013.01); *H01L 2224/4918* (2013.01); *H01L 2224/92* (2013.01); *H01L 2924/01005* (2013.01); *H01L 2924/01006* (2013.01); *H01L 2924/01007* (2013.01); *H01L 2924/01013* (2013.01); *H01L 2924/01014* (2013.01); *H01L 2924/01015* (2013.01); *H01L 2924/01028* (2013.01); *H01L 2924/01029* (2013.01); *H01L 2924/0103* (2013.01); *H01L 2924/01031* (2013.01); *H01L 2924/01047* (2013.01); *H01L 2924/01049* (2013.01); *H01L 2924/01078* (2013.01); *H01L 2924/01079* (2013.01); *H01L 2924/01082* (2013.01); *H01L 2924/01094* (2013.01); *H01L 2924/09701* (2013.01); *H01L 2924/10329* (2013.01); *H01L 2924/10349* (2013.01); *H01L 2924/14* (2013.01); *H01L 2924/19041* (2013.01); *H01L 2924/19042* (2013.01); *H01L 2924/3025* (2013.01); *H01L 2924/01033* (2013.01); *H01L 2924/014* (2013.01)

(56) References Cited

U.S. PATENT DOCUMENTS

| | | | |
|---|---|---|---|
| 5,502,316 A | 3/1996 | Kish et al. | |
| 5,783,477 A | 7/1998 | Kish, Jr. et al. | |
| 5,798,536 A | 8/1998 | Tsutsui | |
| 5,886,401 A * | 3/1999 | Liu | 257/678 |
| 6,057,562 A | 5/2000 | Lee et al. | |
| 6,180,963 B1 | 1/2001 | Arai | |
| 6,222,207 B1 | 4/2001 | Carter-Coman et al. | |
| 6,245,259 B1 | 6/2001 | Hohn et al. | |
| 6,287,882 B1 | 9/2001 | Chang et al. | |
| 6,320,206 B1 | 11/2001 | Coman et al. | |
| 6,396,082 B1 | 5/2002 | Fukasawa et al. | |
| 6,416,194 B1 | 7/2002 | Demiyont | |
| 6,417,019 B1 * | 7/2002 | Mueller et al. | 438/29 |
| 6,429,045 B1 * | 8/2002 | Furukawa et al. | 438/107 |
| 6,458,612 B1 | 10/2002 | Chen et al. | |
| 6,525,335 B1 | 2/2003 | Krames et al. | |
| 6,576,930 B2 | 6/2003 | Reeh et al. | |
| 6,597,019 B2 | 7/2003 | Inoue et al. | |
| 6,627,921 B2 | 9/2003 | Wong et al. | |
| 6,642,652 B2 | 11/2003 | Collins, III et al. | |
| 6,650,044 B1 | 11/2003 | Lowery | |
| 6,682,950 B2 | 1/2004 | Yang et al. | |
| 6,709,883 B2 | 3/2004 | Yang et al. | |
| 6,800,500 B2 | 10/2004 | Coman et al. | |
| 7,009,199 B2 | 3/2006 | Hall | |
| 7,400,037 B2 | 7/2008 | Yang et al. | |
| 2001/0004112 A1 | 6/2001 | Furukawa et al. | |
| 2002/0011601 A1 | 1/2002 | Furukawa et al. | |
| 2002/0053872 A1 | 5/2002 | Yang et al. | |
| 2002/0067125 A1 | 6/2002 | Nogaki et al. | |
| 2002/0079506 A1 | 6/2002 | Komoto et al. | |
| 2002/0080836 A1 | 6/2002 | Hwang | |
| 2002/0093287 A1 | 7/2002 | Chen | |
| 2002/0105003 A1 | 8/2002 | Yang et al. | |
| 2003/0040133 A1 | 2/2003 | Horng et al. | |
| 2003/0087463 A1 | 5/2003 | Horng et al. | |
| 2003/0155579 A1 | 8/2003 | Yang | |
| 2003/0157783 A1 * | 8/2003 | Fonash et al. | 438/458 |
| 2003/0168664 A1 | 9/2003 | Hahn et al. | |
| 2003/0189212 A1 * | 10/2003 | Yoo | 257/79 |
| 2004/0115849 A1 * | 6/2004 | Iwafuchi et al. | 438/25 |
| 2004/0124428 A1 | 7/2004 | Lin et al. | |
| 2005/0023550 A1 * | 2/2005 | Eliashevich et al. | 257/99 |
| 2006/0151801 A1 * | 7/2006 | Doan et al. | 257/99 |
| 2008/0173884 A1 | 7/2008 | Chitnis et al. | |
| 2008/0315236 A1 | 12/2008 | Lu et al. | |

FOREIGN PATENT DOCUMENTS

| | | |
|---|---|---|
| DE | 10118447 A1 | 5/2002 |
| JP | 52-23986 | 6/1977 |
| JP | 57-10280 | 1/1982 |
| JP | 8-330624 | 12/1996 |
| JP | 11-168236 | 6/1999 |
| JP | 2000-91628 | 3/2000 |
| JP | 2000-228563 | 8/2000 |
| TW | 311287 | 7/1997 |
| TW | 474034 | 9/2001 |
| TW | 474034 | 1/2002 |
| TW | 493286 | 7/2002 |

OTHER PUBLICATIONS

Shieu et al., "Effect of a Ti interlayer on the bond strength and thermal stability of the Cu/benzocyclobutene-divinyl tetramethyldisiloxane interface," J. Adhesion Sci. Technol., 1998, pp. 19-28, vol. 12, No. 1, VSP, The Netherlands.

Horng et al., "AlGaInP light-emitting diodes with mirror substrates fabricated by wafer bonding," Applied Physics Letters, Nov. 15, 1999, pp. 3054-3056, vol. 75, No. 20, American Institute of Physics, USA.

Dang er al., "Comparison of Dry and Wet Etch Processes for Patterning SiO2/TiO2 Distributed Bragg Reflectors for Veiitcal-Cavity Surface-Emitting Lasers," Journal of The Electrochemical Society, 2001, G25-G28, vol. 148(2), The Electrochemical Society, Inc., NJ, USA.

Margalith et al., "Indiumtin oxide contacts to gallium nitride optoelectronic devices," Applied Physics Letters, Jun. 28, 1999, pp. 3930-3932, vol. 74, No. 26, American Institute of Physics, USA.

Chua et al., "Dielectrically-Bonded Long Wavelength Vertical Cavity Laser on GaAs substrates Using Strain-Compensated Multiple Quantum Wells," IEEE Phtonics Technology Letters, vol. 6, No. 12, pp. 1400-1402, Dec. 1994.

* cited by examiner (a)

(b)

(a)

(b)

(e)

(f)

OPTOELECTRONIC SYSTEM

REFERENCE TO RELATED APPLICATION

This application is a continuation-in-part application of Ser. No. 10/160,588, filed Jun. 29, 2005, now U.S. Pat. No. 7,928,455 which is a continuation-in-part application of Ser. No. 10/604,245, filed Jul. 4, 2003, now U.S. Pat. No. 6,987,287 and claims the right of priority based on Taiwan application Ser. No. 098124681, filed Jul. 21, 2009, and Taiwan application Ser. No. 098146171, filed Dec. 30, 2009, and the content of which is hereby incorporated by reference.

TECHNICAL FIELD

The application relates to an optoelectronic system, and more particularly to an integrated optoelectronic system.

DESCRIPTION OF BACKGROUND ART

An optoelectronic element such as an LED (Light Emitting Diode) package is usually made from a complicated bare-chip packaging process. An optoelectronic system can be further built by integrating the packaged optoelectronic element with other electronic element such as capacitor, inductor, and/or non-electronic element.

Similar to the trend of small and slim commercial electronic product, the development of the optoelectronic element also enters into an era of miniature package. One promising packaging design for semiconductor and optoelectronic element is the Chip-Level Package (CLP).

SUMMARY OF THE DISCLOSURE

A method of making an optoelectronic system in accordance with the present disclosure is disclosed. The method includes providing a temporary substrate; providing un-packaged optoelectronic elements having sidewalls, top surfaces, and bottom surfaces, at least one of the unpackaged optoelectronic elements having an electrode provided on a side of the bottom surfaces; attaching the bottom surfaces to the temporary substrate such that a trench is formed between two of the un-packaged optoelectronic elements; providing an adhesive material to fully fill the trench and cover the un-packaged optoelectronic elements such that the sidewalls and top surfaces of the un-packaged optoelectronic elements are fully enclosed by the adhesive material; providing a transparent substrate on the adhesive material; and removing the temporary substrate without removing all the adhesive material covering the optoelectronic elements.

DETAILED DESCRIPTION OF PREFERRED EMBODIMENTS

Figure 1:
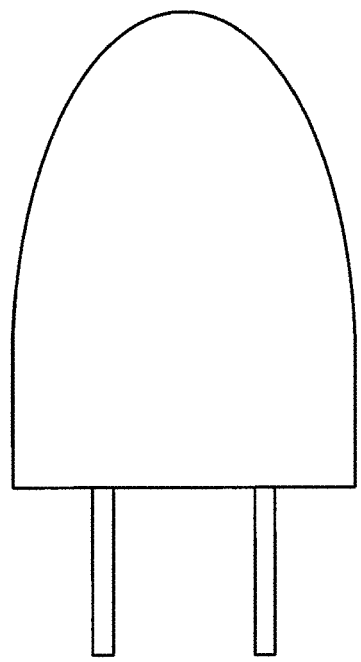
FIG. 1 illustrates a conventional LED package.
Figure 2A:
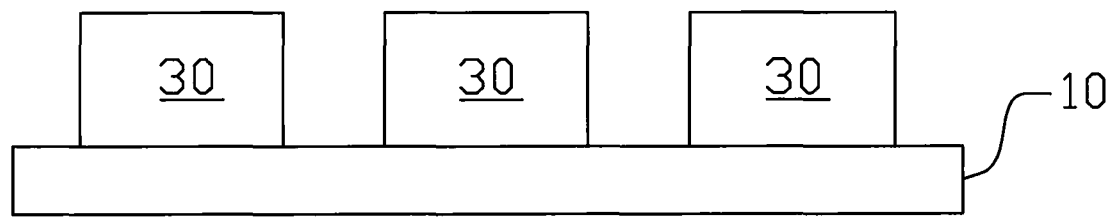
FIGS. 2A~2D illustrate steps of making an optoelectronic system in accordance with an embodiment of the present invention.
Figure 2B:
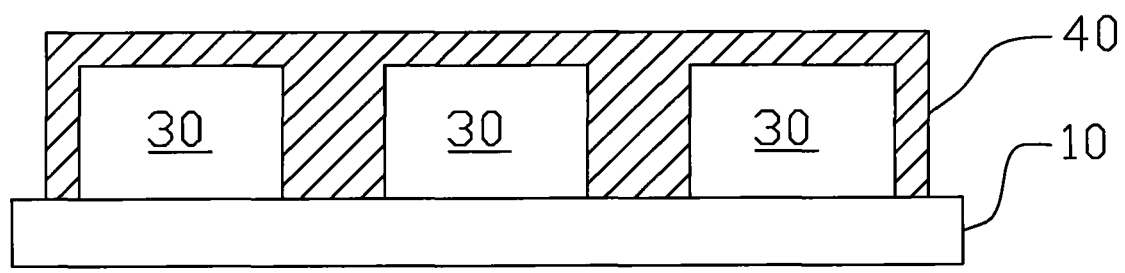
Figure 2C:
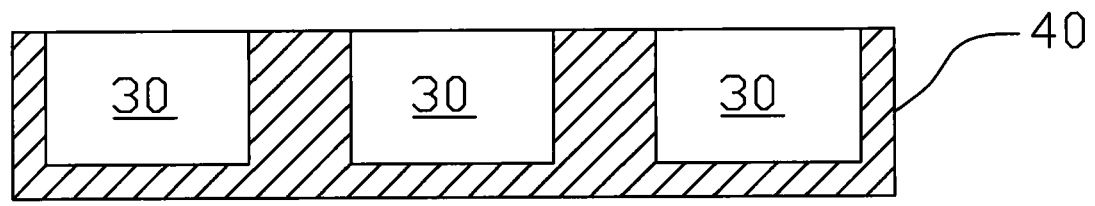
Figure 2D:
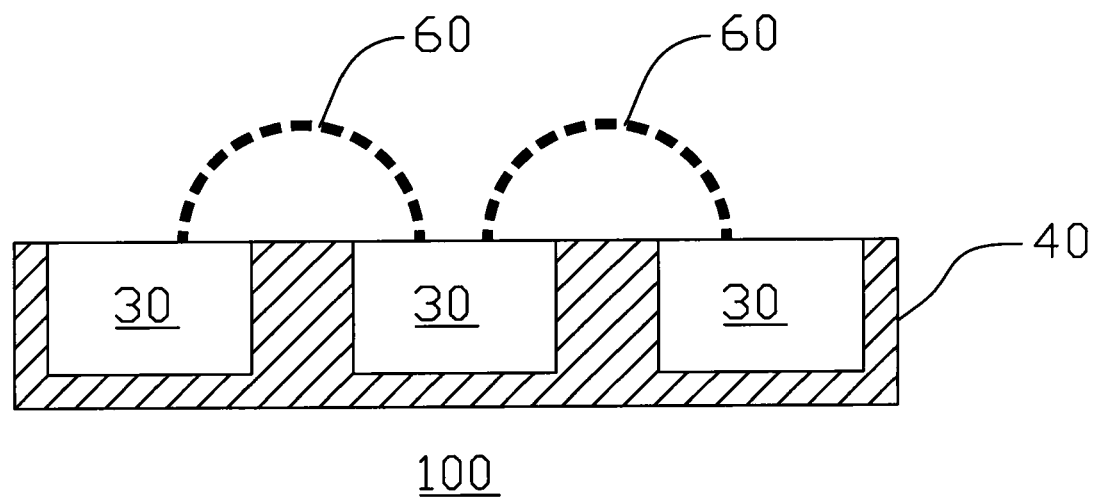

The embodiments are described hereinafter in accompany with drawings.

As shown in FIGS. 2A~2D, a method of making an optoelectronic system 100 in accordance with an embodiment of the present invention is disclosed and includes steps of deploying two or more system units 30 on a carrier 10; confining the spatial relation between the system units 30 by introducing a material 40; separating the system units 30 from the carrier 10; and establishing an electrical connection 60 between any two of the system units. However, the sequence of performing the steps is not limited to the aforementioned and can be freely adjusted according to the actual manufacturing environment or conditions.

The optoelectronic system 100 in accordance with one embodiment of the present invention includes two or more system units 30 which are connected in a network of transmitting and/or converting luminous energy and electric energy. The system unit 30 is a part of the network and provides luminous energy, electric energy, or both. For example, the optoelectronic system 100 is capable of receiving signal and/or electric energy to output luminous energy, or receiving luminous energy to output electric energy and/or signal. The optoelectronic system 100 can be used in various fields such as illumination, display, image recognition, image reproduction, power supply, data storage, and machining.

Specifically, the optoelectronic system 100 is an integration, combination, and/or stack of the system units 30 which have optoelectronic function(s) and can be LED, photodiode, photoresistor, laser, infrared emitter, solar cell, and any combination thereof. Moreover, the optoelectronic system 100 can optionally include other non-optoelectronic system unit 30, such as resister, capacitor, inductor, diode, and integrated circuit.

The carrier 10 is provided as a base for growing and/ore supporting the system unit 30. The candidates for carrier material include but not limited to Ge, GaAs, InP, sapphire, SiC, Si, LiAlO$_2$, ZnO, GaN, AlN, metal, glass, composite, diamond, CVD diamond, and DLC (Diamond-Like Carbon).

In one embodiment of the present invention, the whole or part of the main structure of one or more system units 30 is formed on the carrier 10. Specifically, the carrier 10 is functioned as a ground structure of the system unit 30. For example, one or more system units 30 are formed on the carrier 10 by chemical deposition, physical deposition, electroplating, synthesis, and/or self-assembly. Moreover, other than the aforementioned methods, cutting, grinding, polishing, photo-lithography, etching, and/or thermal treatment can be optionally introduced to the steps of forming the system unit 30.

The system unit 30 in accordance with one embodiment of the present invention is an optoelectronic semiconductor structure which is made by epitaxially growing semiconductor layers on a growth substrate which is used as the carrier 10. Provided two or more system units 30 are formed on a common substrate, the adjoining system units 30 can be electrically and/or physically separated by trench or insulating region.

However, the electrical layout of the system units 30 can be also formed by internal connection, external connection, or both. Taiwan patents, No. 434917 and No. I249148 are pertinent to the same and issued to the assignee of present application, and the content of which is hereby incorporated by reference.

Specifically, system unit 30 at least includes a first conductivity layer, a conversion unit, and a second conductivity layer. At least two parts of the first conductivity layer and the second conductivity layer are two individual single layer or two individual multiple layers ("multiple layers" means two or more than two layers) having different electrical properties, polarities, dopants or providing electrons and holes. If the first conductivity layer and the second conductivity layer are composed of semiconductor materials, whose electrical properties could be composed of any two of p-type, n-type, and i-type. The conversion unit disposed between the first conductivity layer and the second conductivity layer is a region where the luminous energy and the electrical energy can transfer or can be induced to transfer. The system unit in which the electrical energy is transferred to the light energy is such as a light-emitting diode, a liquid crystal display, or an organic light-emitting diode; the one that the light energy is transferred to the electrical energy is such as a solar cell, or an optoelectronic diode.

The system unit 30 in accordance with another embodiment of the present invention is an LED (light-emitting diode). The light emission spectrum of the LED can be adjusted by changing the physical or chemical arrangement of one semiconductor layer or more semiconductor layers. The materials such as the series of aluminum gallium indium phosphide (AlGaInP), the series of aluminum gallium indium nitride (AlGaInN), the series of zinc oxide (ZnO) and so on are commonly used. The conversion unit such as single heterostructure (SH), double heterostructure (DH), double-side double heterostructure (DDH), or multi-quantum well (MQW) are usually formed. Besides, the wavelength of the emitting light could also be adjusted by changing the number of the pairs of the quantum well in the MQW structure.

In one embodiment of the present invention, one or more system unites 30 are built up before being mounted on the carrier 10. In other words, the carrier 10 and the system unit 30 are independent from each other before establishing connection. Specifically, the carrier 10 is used to support the system unit 30. For example, one or more system units 30 are mounted on the carrier 10 by means of glue, metal, pressure, and/or heat. Taiwan patents, No. 311287, No. 456058, No. 474034 and No. 493286 are pertinent to the same and issued to the assignee of present application, and the content of which is hereby incorporated by reference. Moreover, during establishing the connection, the system unit 30 can automatically or manually be placed on the carrier 10.

Figure 3:
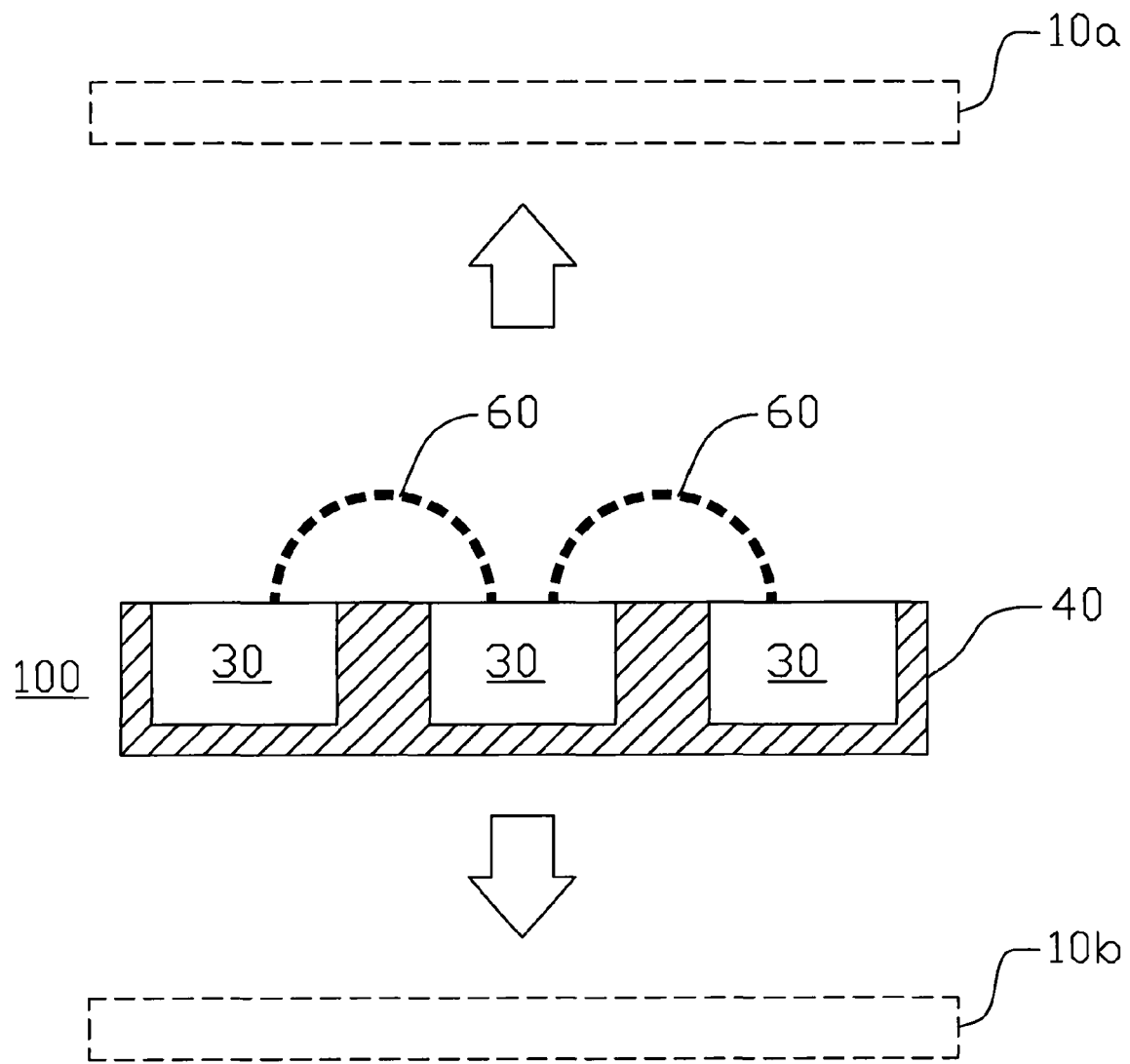
FIG. 3 illustrates an optoelectronic system in accordance with an embodiment of the present invention.

As shown in FIG. 3, the finished or semi-finished optoelectronic system 100 can be optionally further connected to an external body. The external body can be connected to one or two sides of the optoelectronic system 100. In several embodiments, the optoelectronic system 100 is connected to the external body 10a by one side of an electrical connection 60; the optoelectronic system 100 is connected to the external body 10b by another side opposite to the electrical connection 60; the optoelectronic system 100 is connected to the external body 10a by the side of the electrical connection 60 and to the external body 10b by the side opposite to the electrical connection 60. The connection of the optoelectronic system 100 and the external body is not limited to above-mentioned, but any surface of the optoelectronic system 100 can be connected to a proper external body. The external body can be a specific unit, component, device, system, composition, and any combination thereof. For example, the external body is a substrate formed by material as those of the carrier 10, a circuit integration, an optoelectronic system, an active element, a passive element, a circuit element integration, and/or a fixture.

Figure 4:
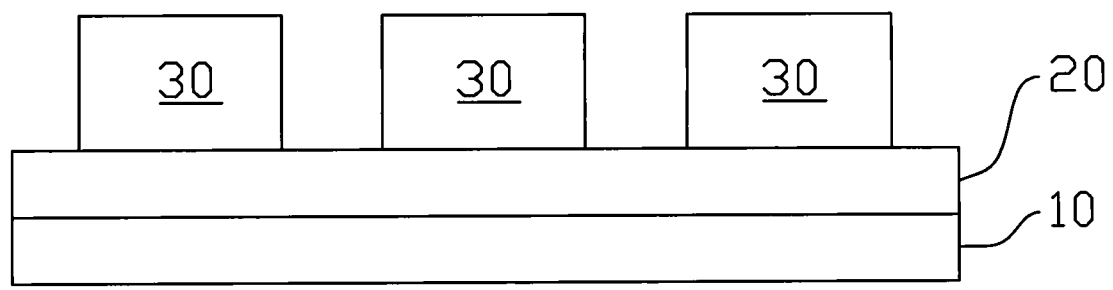
FIG. 4 illustrates a system unit and a carrier in accordance with an embodiment of the present invention.

In one embodiment of the present invention, a layer or structure 20 is further formed between the system unit 30 and the carrier 10, as shown in FIG. 4. The layer or structure 20 is expected to develop a short-term or long-term connection between a part or whole of the system unit 30 and the carrier 10. Herein, "short-term" is used to indicate a time point by or on the time the optoelectronic system 100 is made, delivered or unloaded; "long-term" is used to indicate a time point after the time the optoelectronic system 100 is made, delivered, or unloaded. In other words, the system unit 30 and the carrier 10 are not necessary to separate from each other. Specifically, the layer or structure 20 includes, for example, glue, alloy, semiconductor, adhesive tape, metallic single-layer, metallic multi-layer, jig, or any combination thereof. In addition, the layer or structure 20 possess not only a function to form a connection but also an optional function for reflecting, anti-reflecting, current-blocking, diffusion-blocking, stress-release, heat-conduction, and/or heat-insulation. For example, the layer or structure 20 includes a reflecting surface, an upper inter-layer positioned between the system unit 30 and the reflecting surface, and a lower inter-layer positioned between the system unit 30 and the reflecting surface. Except the reflecting function, one or both of the upper inter-layer and the lower inter-layer may possess at least one of the above-mentioned functions such as the function of connection, diffusion-blocking.

Figure 5:
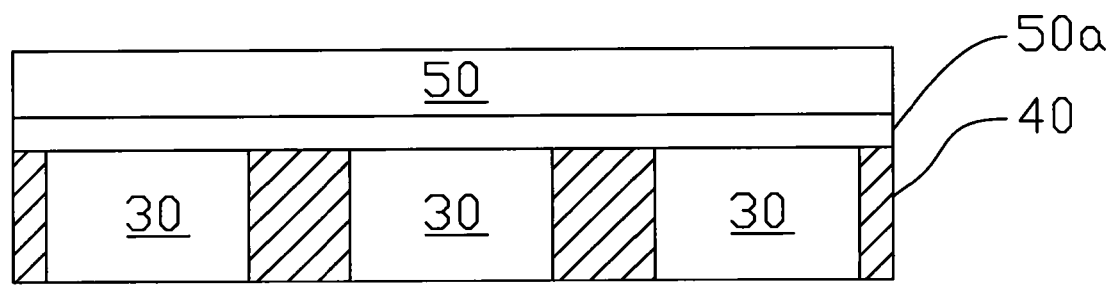
FIG. 5 illustrates a system unit and a sub-carrier in accordance with an embodiment of the present invention.

In another embodiment of the present invention, the system unit 30 and the material 40 can be further connected to a sub-carrier 50, as shown in FIG. 5. The connection step may be executed before or after any step of FIGS. 2A~2D. Preferably, the connection step is executed after the material 40 is introduced into the workflow, for example, after the steps of FIG. 2B, FIG. 2C, or FIG. 2D. Provided the sub-carrier 50 is connected to the system unit 30 and the material 40 after the step of FIG. 2B, one may obtain a much reliable semi-finished structure to be used in following manufacturing steps. The sub-carrier 50 and the system unit 30 can be connected with each other by using the method listed in the description directed to FIG. 4, such as compression, heating, or any combination thereof. Specifically, a connection layer 50a is formed between the sub-carrier 50 and the system unit 30 to combine both.

In addition, the connection layer 50a may possess not only the function of connection but also an optional function for reflecting, anti-reflecting, current-blocking, diffusion-blocking, stress-release, heat-conduction, and/or heat-insulation. It is not necessary to add an additional element to achieve such function(s), but by adjusting the composition, geometric shape, and/or process method of the sub-carrier 50 can accomplish the same. For example, a reflecting, refracting, scattering, concentrating, collimating, and/or shielding structure can be formed on at least one light-exiting surface of the sub-carrier 50. The light-exiting surface is a surface contacting with the system unit 30, the material 40, and/or the environmental medium. Specifically, the reflecting, refracting, scattering, concentrating, collimating, and/or shielding structure are/is, for example, at least one of a mirror, regular concave and convex, irregular concave and convex, high refraction index difference interface, photonic crystal, concave lens, convex lens, Fresnel lens, and opaque surface.

Figure 6:
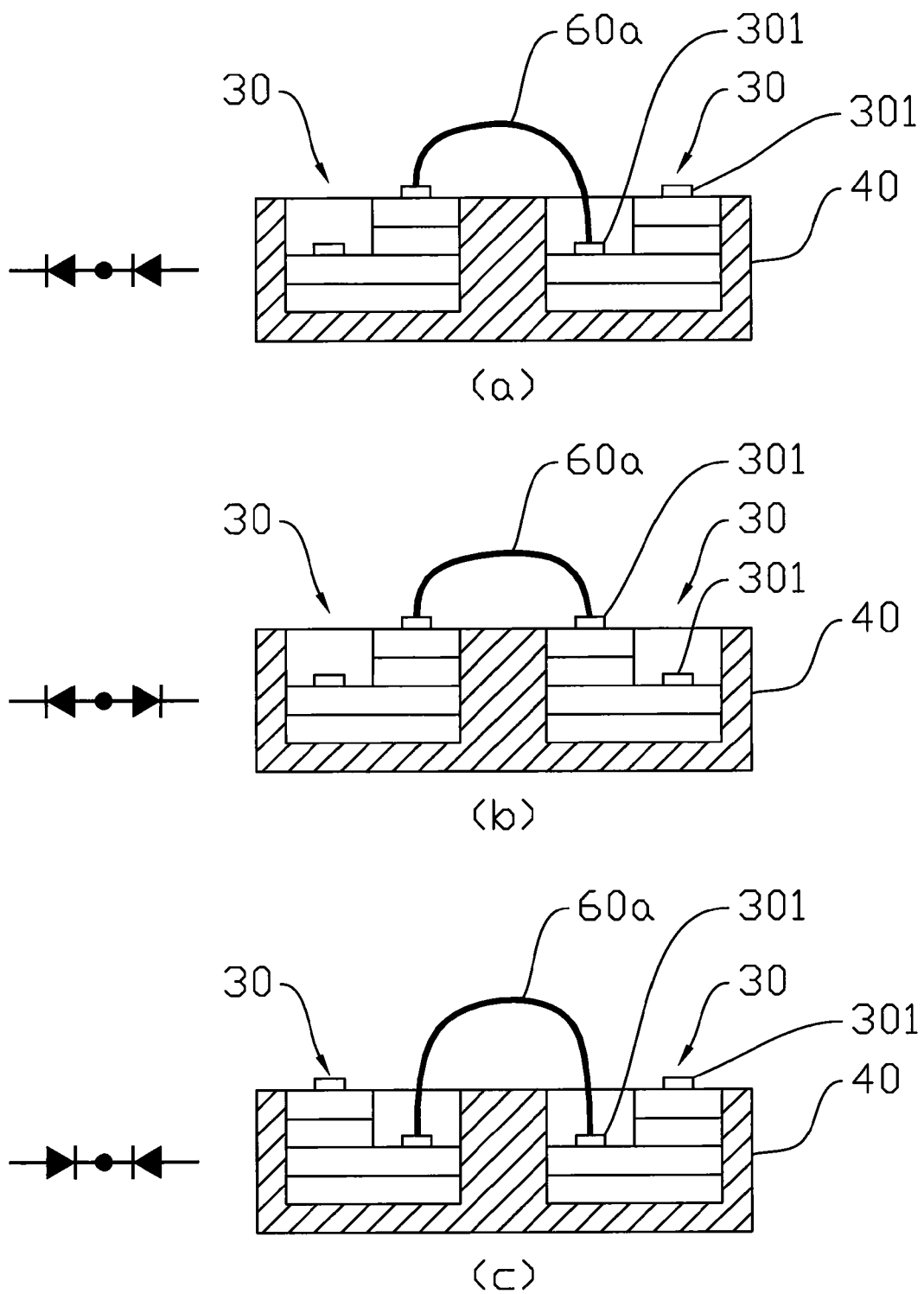
FIG. 6 illustrates electrical connections of system units in an optoelectronic system in accordance with an embodiment of the present invention.

FIG. 6 illustrates the electrical connections of at least two system units 30 in the optoelectronic system 100 in accordance with one embodiment of the present invention. The system unit 30 herein includes two electrodes oriented in the same direction. Specifically, such system unit 30 is, for example, a light-emitting diode, more specific, is a light-emitting diode formed on an insulator, such as sapphire. In FIG. 6(a), two system units 30 are coupled together in an anode-cathode connection by wire 60a. In FIG. 6(b), two system units 30 are coupled together in an anode-anode connection by wire 60a. In FIG. 6(c), two system units 30 are coupled in a cathode-cathode connection by wire 60a.

Figure 7:
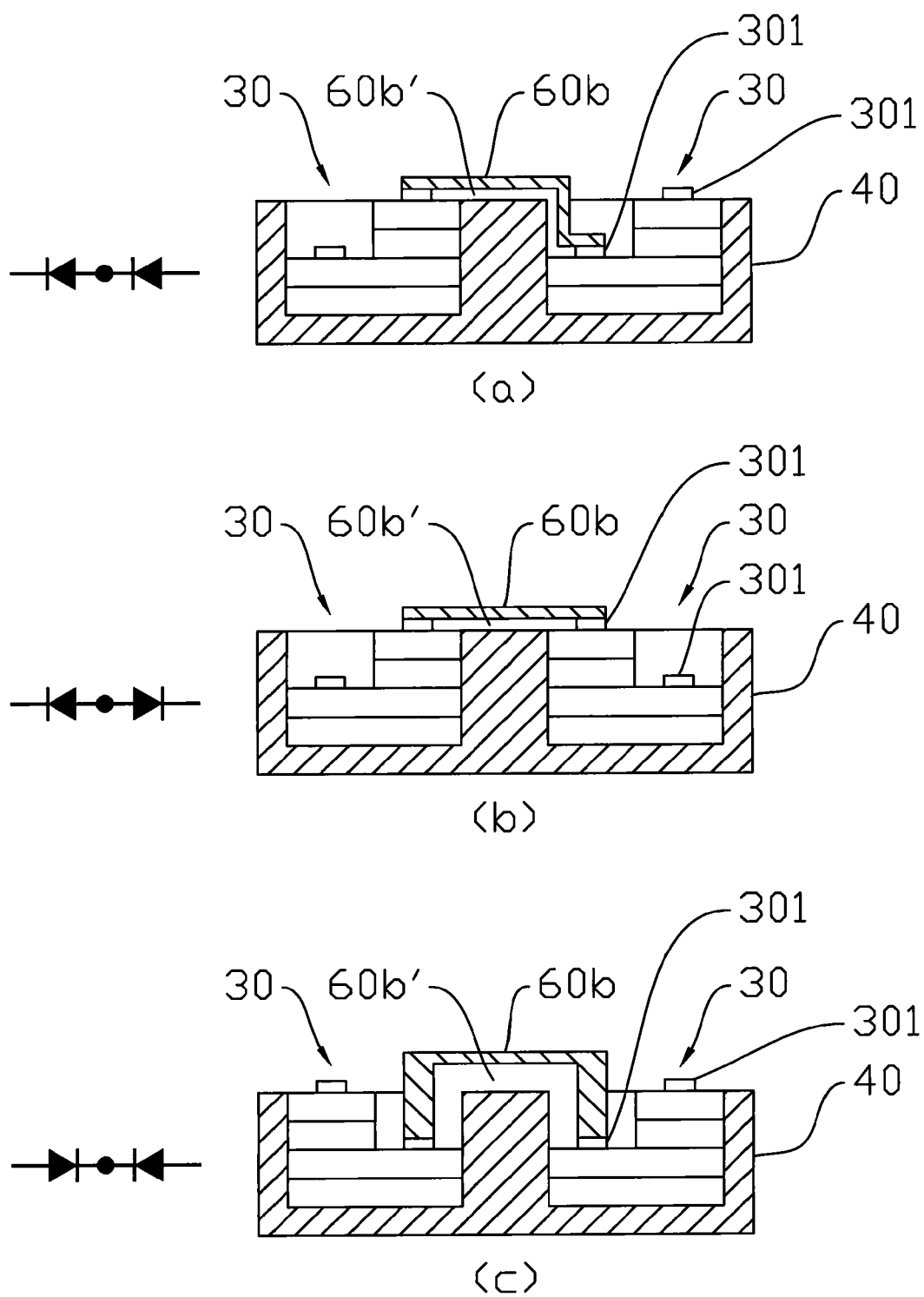
FIG. 7 illustrates electrical connections of system units in an optoelectronic system in accordance with another embodiment of the present invention.

FIG. 7 illustrates the electrical connections of at least two system units 30 in the optoelectronic system 100 in accordance with another embodiment of the present invention. The detail can be referred to the description of FIG. 6. However, in present embodiment, the electrical connection between the system units 30 are built by an internal connection 60b which can be formed by depositing metallic material on a separating zone 60b' formed on predetermined areas of the system units 30.

Figure 8:
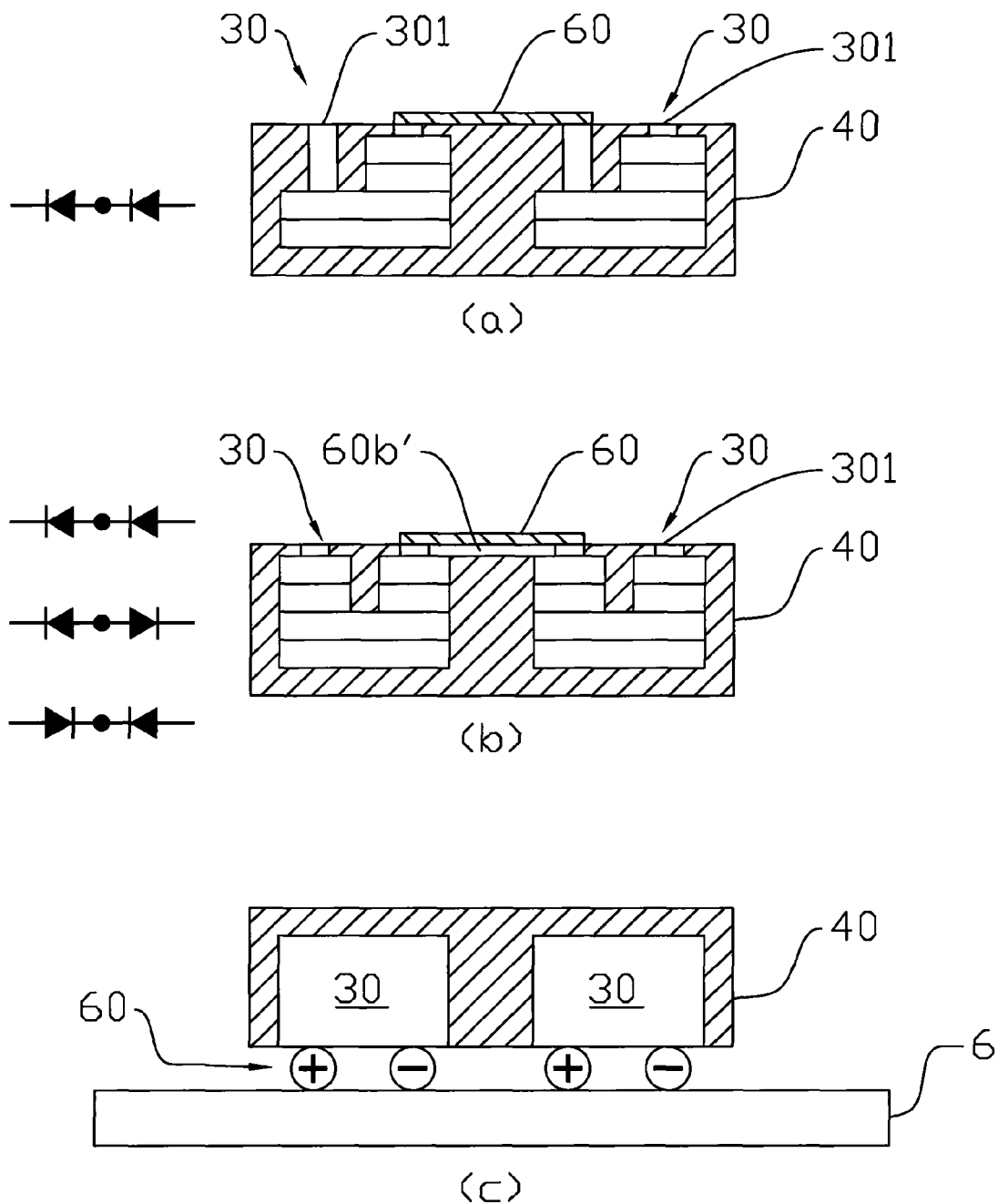
FIG. 8 illustrates electrical connections of system units in an optoelectronic system in accordance with further embodiment of the present invention.
Figure 9A:
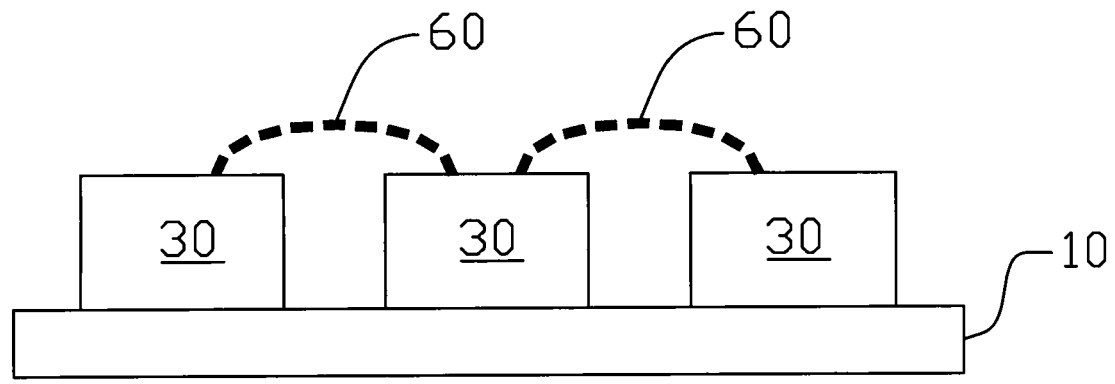
FIGS. 9A~9D illustrate steps of making an optoelectronic system in accordance with another embodiment of the present invention.
Figure 9B:
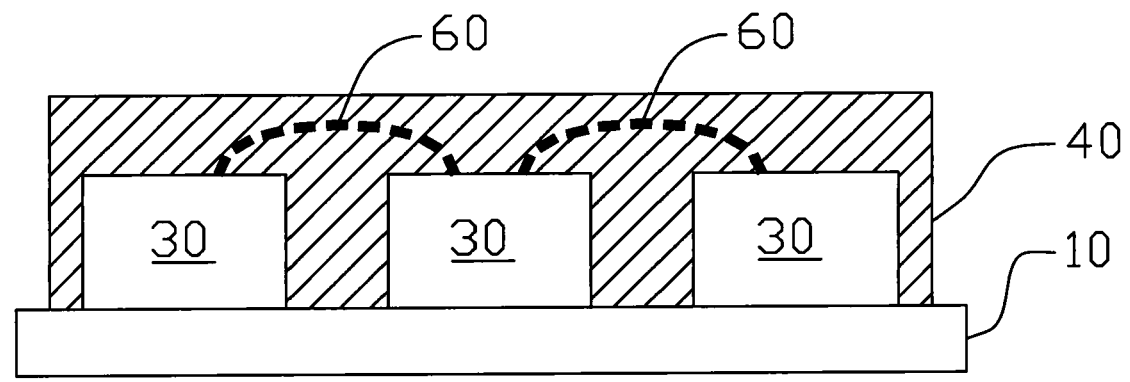
Figure 9C:
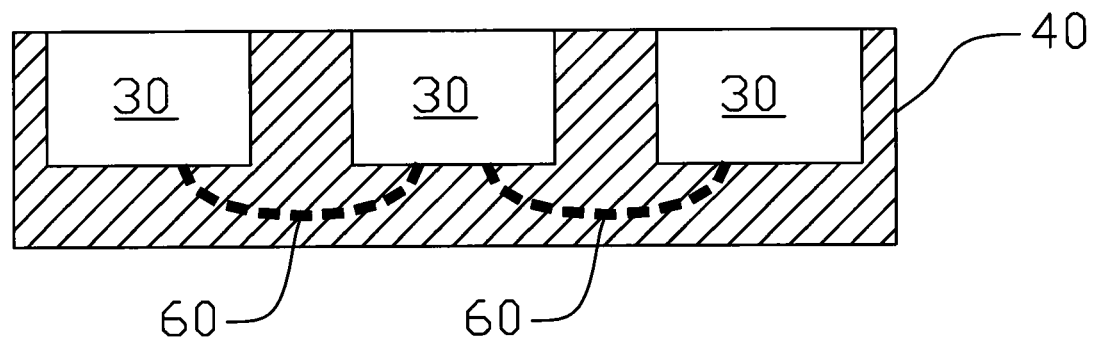
Figure 9D:
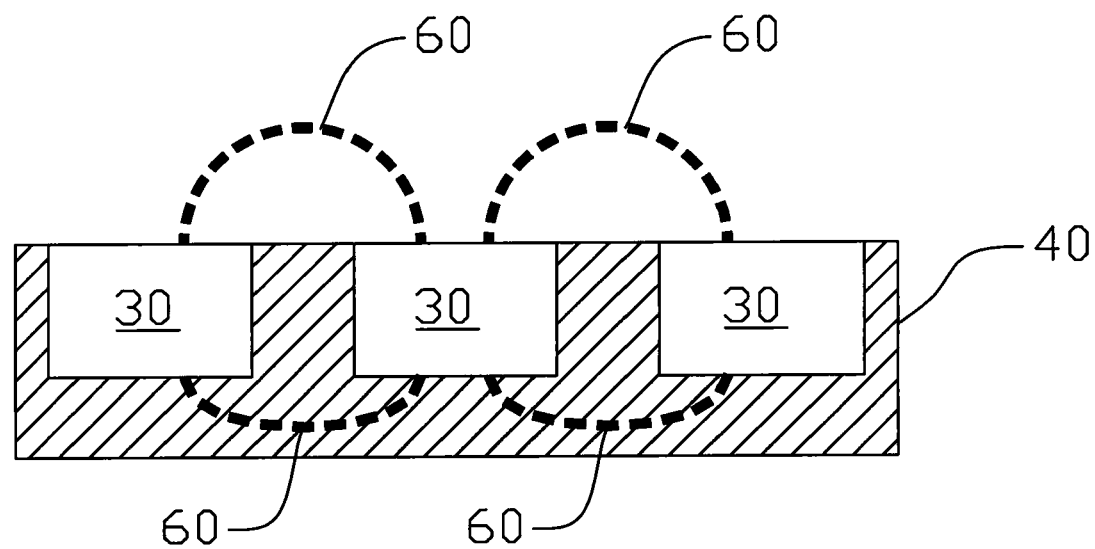

FIG. 8 illustrates the electrical connections of at least two system units 30 in the optoelectronic system 100 in accordance with further embodiment of the present invention. In FIGS. 8(a) and 8(b), the electrodes of the system units 30 are configured or extended to about the same elevation. Two system units 30 shown in FIG. 8(a) are coupled in an anode-cathode connection by wire 60a or internal connection 60b. Two system units 30 shown in FIG. 8(b) are coupled together in any one of three type connections as shown of the equivalent circuits by wire 60a or internal connection 60b. In FIG. 8(c), two system units 30 shown in FIG. 8(b) are coupled to a circuit carrier 60c as a part of an electrical network.

As shown in FIGS. 9A~9D, a method of manufacturing the optoelectronic system 100 in accordance with another embodiment of the present invention is described as follows. Two or more system units 30 are firstly deployed on a carrier 10 and arranged to form an electrical connection 60 on one side thereof; confining the spatial relation between the system units 30 by introducing a material 40; separating the system units 30 from the carrier 10; and forming another one electrical connection 60 on another side. However, the above-mentioned steps are not limited to be performed or chosen in such sequence, and can be arranged according to the actual manufacturing environments or conditions. In addition, the electrical connections 60 on the two sides of the two system units 30 are not limited the quantity or position shown in the drawings, the user may arrange or modify them according to the characteristic of the circuit. Moreover, under no obvious contradiction, the other embodiments can be referred by or used in present embodiment.

Figure 10:
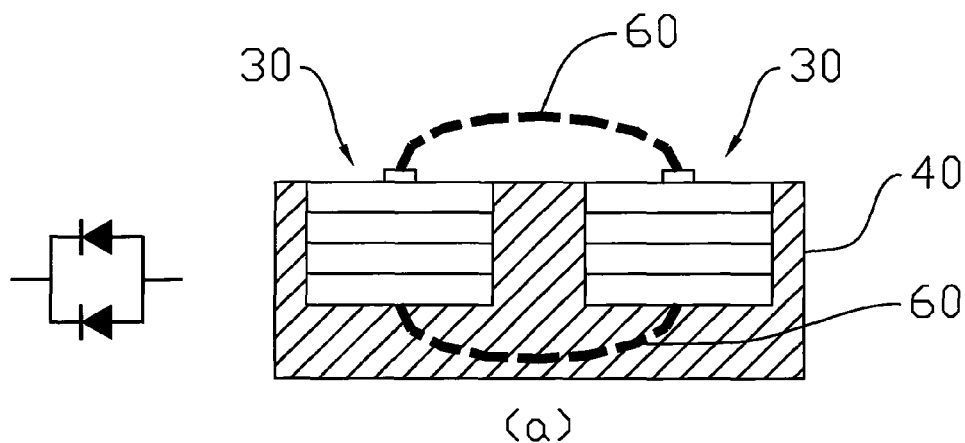
FIG. 10 illustrates electrical connections of system units in an optoelectronic system in accordance with an embodiment of the present invention.
Figure 10:
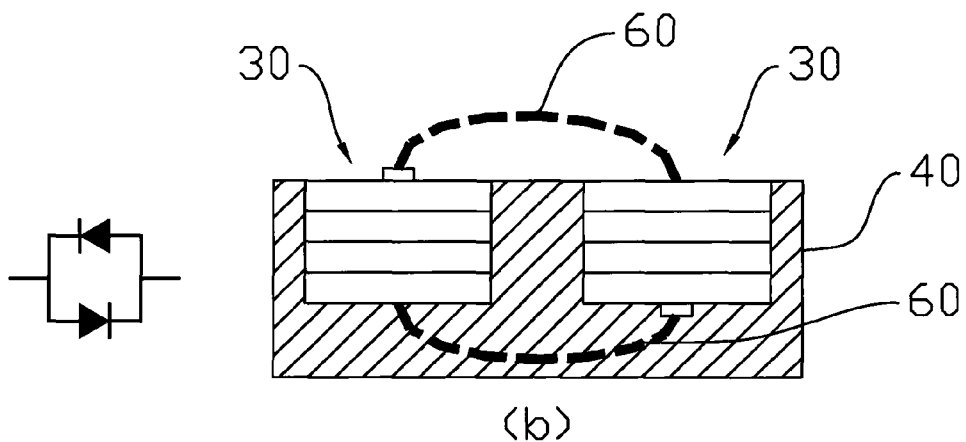
Figure 10:
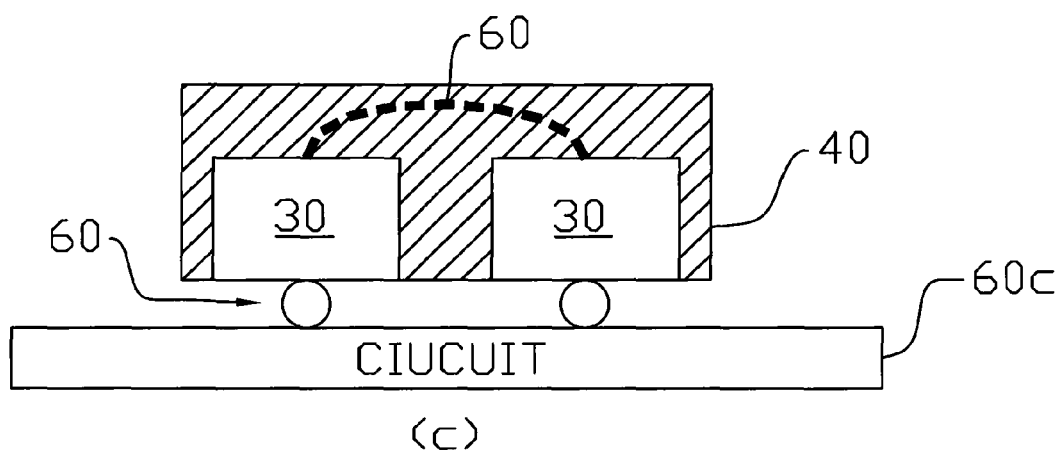

FIG. 10 illustrates the electrical connections of at least two system units 30 in the optoelectronic system 100 in accordance with one embodiment of the present invention. In FIG. 10(a), two system units 30, which are oriented in the same direction, are coupled together in a parallel connection by electrical connection 60. In FIG. 10(b), two system units 30, which are reversely-oriented, are coupled together in an anti-parallel connection by electrical connection 60. However, the system units 30, which are oriented in the same direction, can be also coupled together in an anti-parallel connection by an applicable layout of the electrical connection 60. In FIG. 12(c), two system units 30 are coupled to a circuit carrier 60c as a part of an electrical network.

Figure 11:
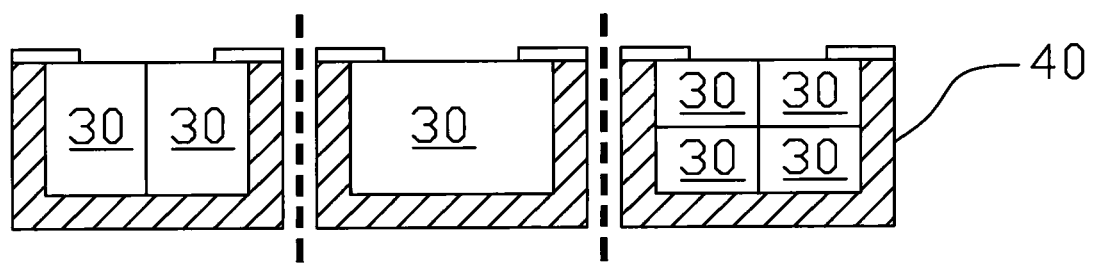
FIG. 11 illustrates sub-groups of an optoelectronic system in accordance with an embodiment of the present invention.

In one embodiment of the present invention, the system units 30, which are confined in the material 40, can be further divided into sub-groups with equal or unequal quantity, as shown in FIG. 11. However, the quantity and layout of the system units 30 are only illustrative, but not to limit the application of the present invention. Without obvious contradiction, the system elements disclosed in other embodiments can be introduced into the present embodiment. Furthermore, the electrical connection among the system units 30 of the sub-group can be referred to the other relevant embodiments of the present invention. The method of forming the sub-group can be chemical means, physical means, or the combination thereof. The chemical means can be etching. The physical means can be mechanical cutting, polishing, laser cutting, water jet, thermal splitting, and/or ultrasonic vibration. The width of the material 40 between the neighboring system units 30 is preferably greater than a working tolerance of the dividing method. For example, the width of the material 40 between two sub-groups is set to be greater than or about a blade thickness of a dicing saw used to cut the material 40. In practice, the blade thickness of the dicing saw ranges from few micrometers to few millimeters, such as 20 μm~2 mm. The detail of dicing saw can be referred to the web sites of dicing saw providers.

Figure 12:
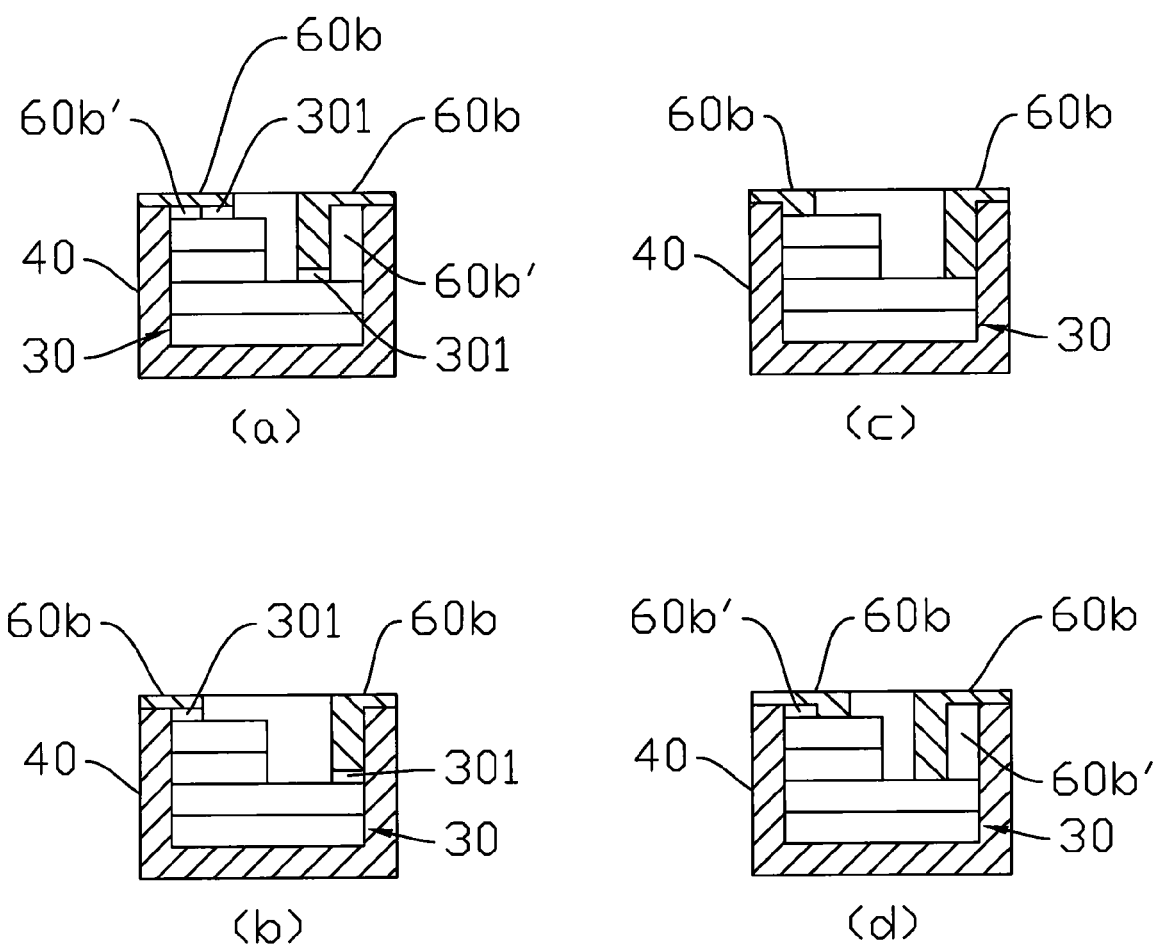
FIG. 12 illustrates electrical connection infrastructures of sub-groups in accordance with an embodiment of the present invention.

FIG. 12 illustrates the electrical connection of the sub-group in accordance with one embodiment of the present invention. However, the structures of system units in the drawing are only illustrative, but not to limit embodiment of the present invention. Without obvious contradiction, the system elements disclosed in other embodiments can be introduced into the present embodiment. In FIG. 12(*a*), the electrical connection 60*b* bridges the separating zone 60*b*' and is settled on the electrode 301 of the system unit 30 and the material 40. In FIG. 12(*b*), one end of the electrical connection 60*b* is electrically connected to the electrode 301 of the system unit 30 while the other end is directly settled on the material 40. In FIG. 12(*c*), the electrical connection 60*b* is electrically connected to the system unit 30 without passing the electrode 301, and is directly settled on the material 40. In FIG. 12(*d*), the electrical connection 60*b* is electrically connected to the system unit 30 without passing the electrode 301 and bridged on the separating zone 60*b*' to settle on the material 40.

Figure 13:
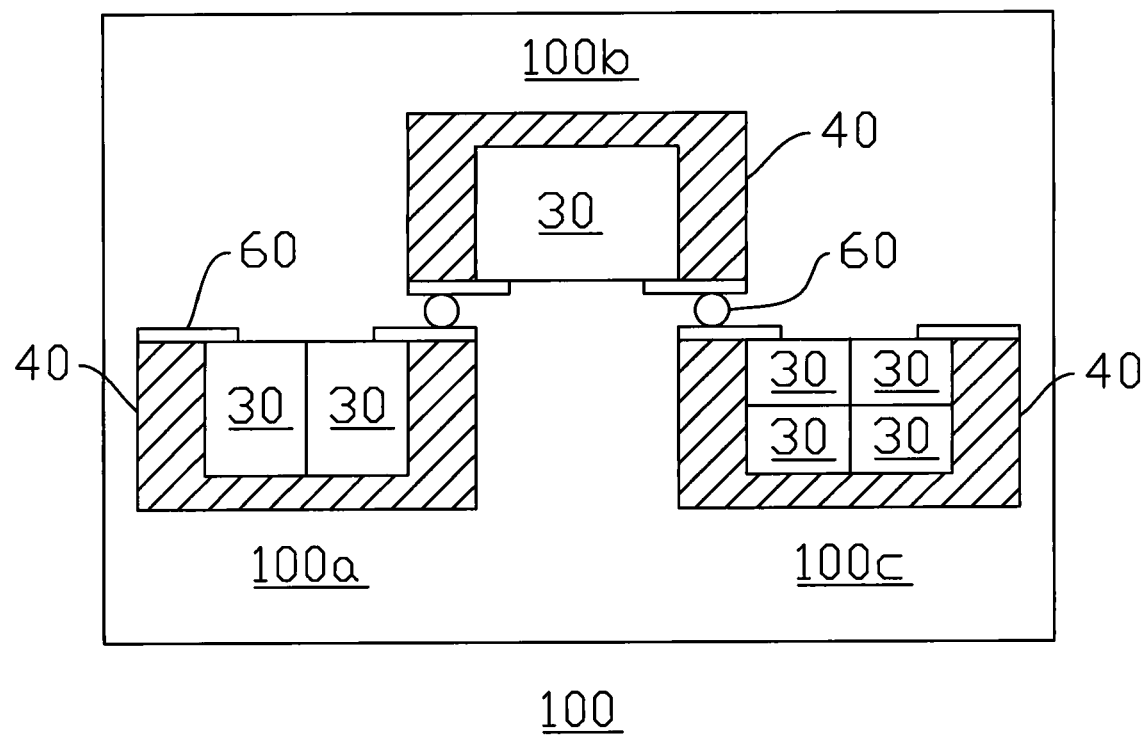
FIG. 13 illustrates electrical connection infrastructure of sub-groups in accordance with another embodiment of the present invention.

As shown in FIG. 13, the optoelectronic system 100 in accordance with an embodiment of the present invention includes sub-groups constructed in two or more dimensions. The quantity and the connecting mode of the system units in each sub-group can be identical or different. For example, the sub-groups 100*a* and 100*c* are stacked on the sub-group 100*b*, wherein the sub-group 100*a* includes four system units 30; the sub-group 100*b* includes one system unit 30; the sub-group 100*c* includes two system units 30. The sub-groups can be electrically connected with each other by solder, silver glue, or other suitable conductive material. However, the sub-groups are not necessary to electrically connect with each other, i.e. the sub-groups are simply aggregated together. The structure or quantity of the system unit 30 in the drawing is only illustrative, but not to limit to the embodiment of the present invention. Under no obvious contradiction, the system unit and the connecting mode of other embodiments can be introduced to present embodiment.

Figure 14:
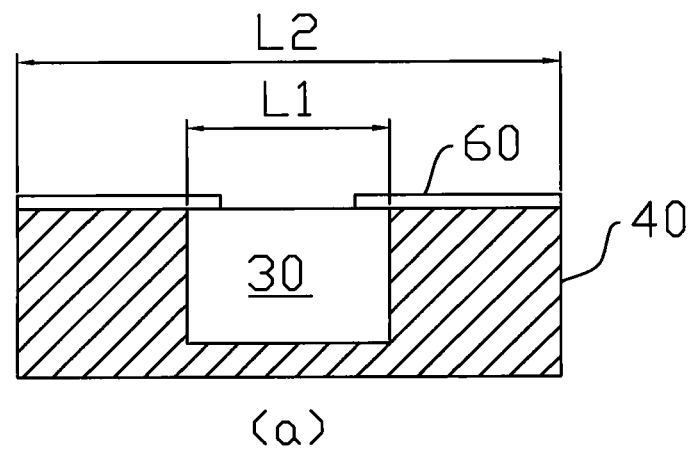
FIG. 14 illustrates the dimensions of one system unit in accordance with an embodiment of the present invention.
Figure 14:
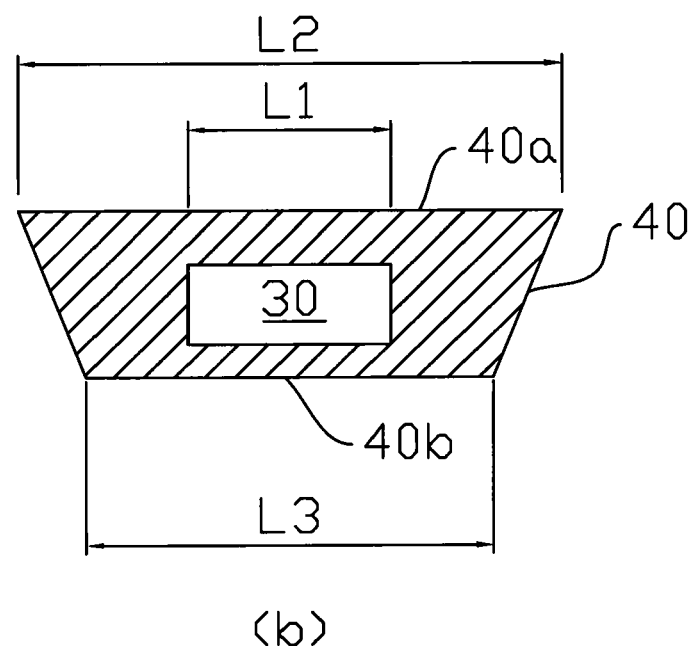

FIG. 14(*a*) shows the width L2 of the sub-group and the width L1 of the system nit 30. L1/L2 is defined as X, and 0.05≤X≤1, preferably, 0.1≤X≤0.2, 0.2≤X≤0.3, 0.3≤X≤0.4, 0.4≤X≤0.5, 0.5≤X≤0.6, 0.6≤X≤0.7, 0.8≤X≤0.9, and/or 0.9≤X≤1. Specifically, L1/L2=260/600, or 580/1000. FIG. 14(*b*) illustrates a cross-sectional view of a sub-group in accordance with an embodiment of the present invention, wherein the contour of which is a trapezoid. The dimensional relation of the trapezoid is listed as follows: L2>L1, L2>L3. One or more system units 30 are positioned in the sub-group as shown in the drawing, however, the position of the system unit relative to the edge of the material 40 is not fixed, i.e. at least one edge of the system unit 30 can be arranged to touch or reach beyond the edge of the material 40. For example, the system unit 30 can be arranged to approach, touch, or protrude the upper boundary 40*a* and/or the lower boundary 40*b* of the material 40.

Figure 15:
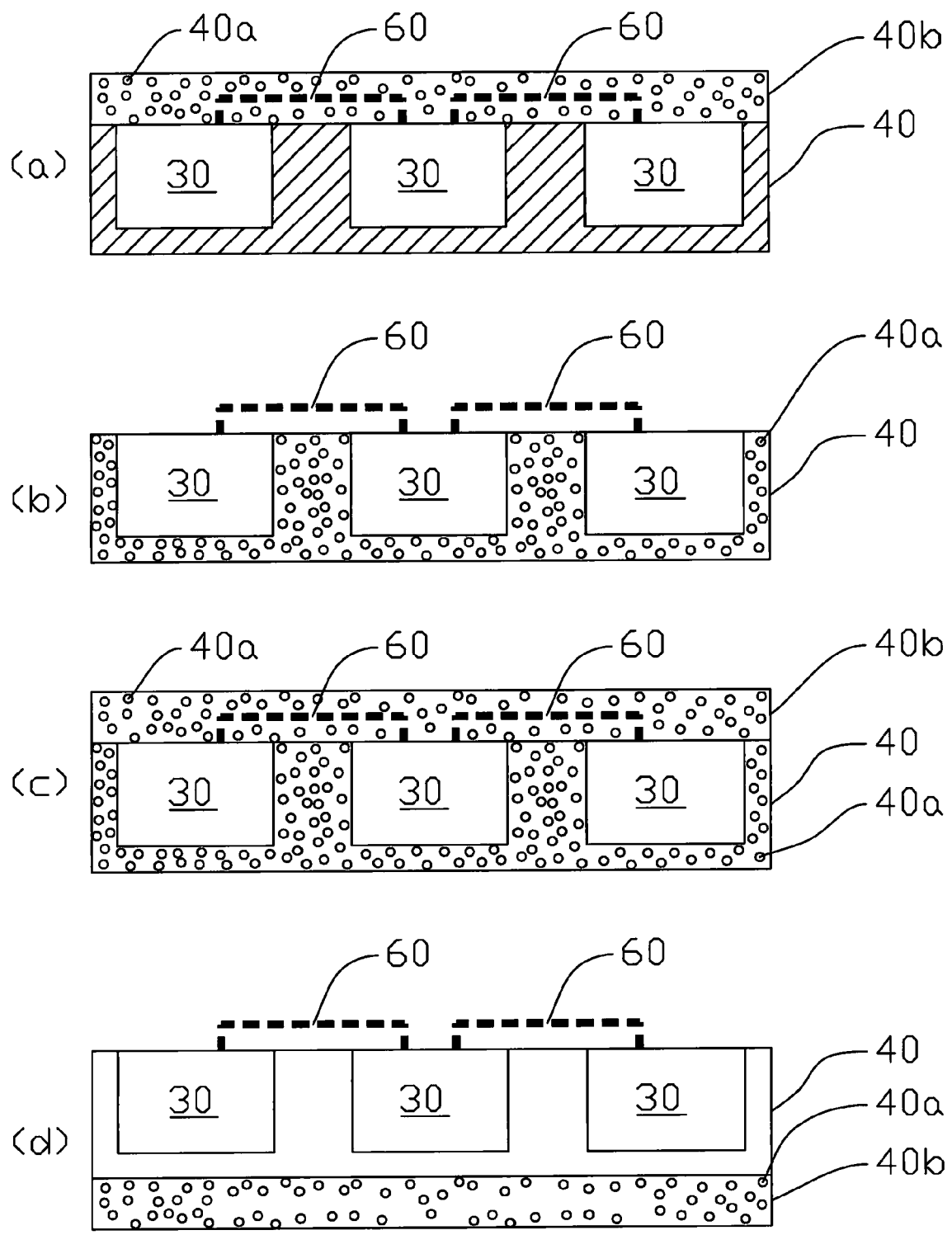
FIG. 15 illustrates a deployment of a wave conversion material in an optoelectronic system in accordance with an embodiment of the present invention.

As shown in FIG. 15, in one embodiment, the light-emitting system, sub-group, or system unit (herein collectively called "light source") is integrated with a wave conversion material. Specifically, the wave conversion material can be composed of a material 40*a*, a material 40*b*, or a combination of materials 40*a* and 40*b*. The material 40*a* is, for example, phosphor powder, dye, semiconductor, or ceramic powder. The material 40*b* is phosphor bulk, sintered bulk, ceramic bulk, organic glue, or inorganic glue. The material 40*a* can be integrated with the material 40, material 40*b*, or both in or after the above-mentioned manufacturing process of the light source. For example, the phosphor powder is mixed with the material 40 and then put on or filled in the system unit 30, or the wave conversion material is boded to, dropped, screen-printed, and/or deposited on the system unit 30. In FIG. 15(*a*), the material 40*a*, material 40*b*, or both of the materials 40*a* and 40*b* are arranged in a light-exiting direction of the light source, preferably, on the light source. In FIG. 15(*b*), the material 40*a* is mixed with the material 40. In FIG. 15(*c*), the materials 40*a* and 40*b* are arranged as a combination of FIGS. 15(*a*) and 15(*b*). In FIG. 15(*d*), the material 40*a*, material 40*b*, or the combination of the materials 40*a* and 40*b* are arranged in a light-exiting direction of the light source, but not contacting with the light source, preferably, contacting with the material 40.

Figure 16:
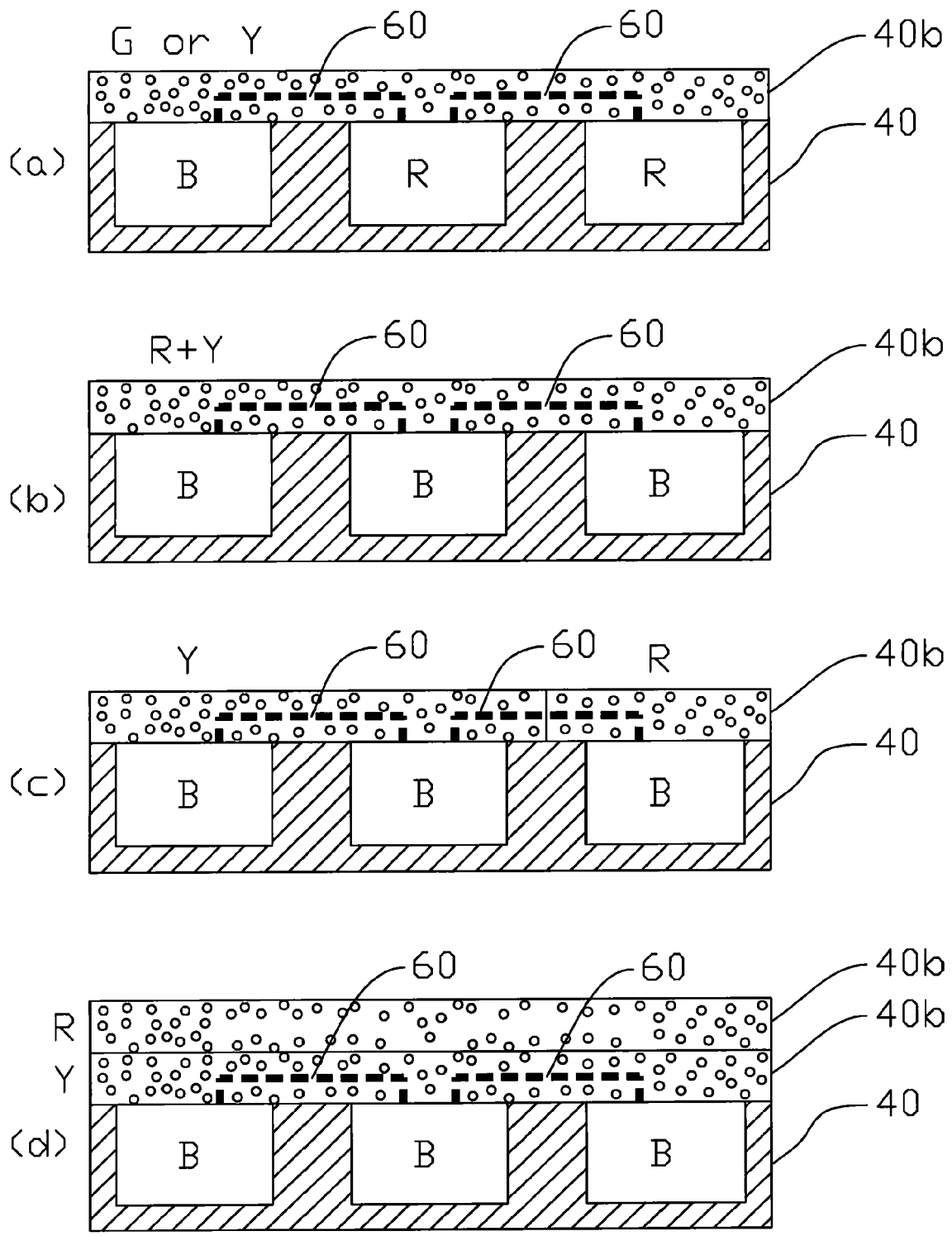
FIG. 16 illustrates a deployment of a wave conversion material in an optoelectronic system in accordance with another embodiment of the present invention.

As shown in FIG. 16, the light-emitting system, sub-group, or the system unit (herein collectively called "light source") emits blue light, and is covered by the wave conversion material. The detail embodiment of the wave conversion material can be referred to the description of FIG. 15. In FIG. 16(*a*), the wave conversion material emits green light or yellow light. In FIG. 16(*b*), the wave conversion material emits red light or yellow light. In FIG. 16(*c*), a region of the wave conversion material emits yellow light; the other region thereof emits red light, wherein the two regions do not overlap with each other. Preferably, the area of yellow light is greater than that of red light. In FIG. 16(*d*), a region of the wave conversion material emits yellow light; the other region thereof emits red light, wherein the two regions overlap with each other. Preferably, the region of yellow light is closer to the light source than the region of red light. Specifically, in the above cases, the color lights are generated from the corresponding phosphor powder or phosphor bulk which is excited by blue light.

Figure 17:
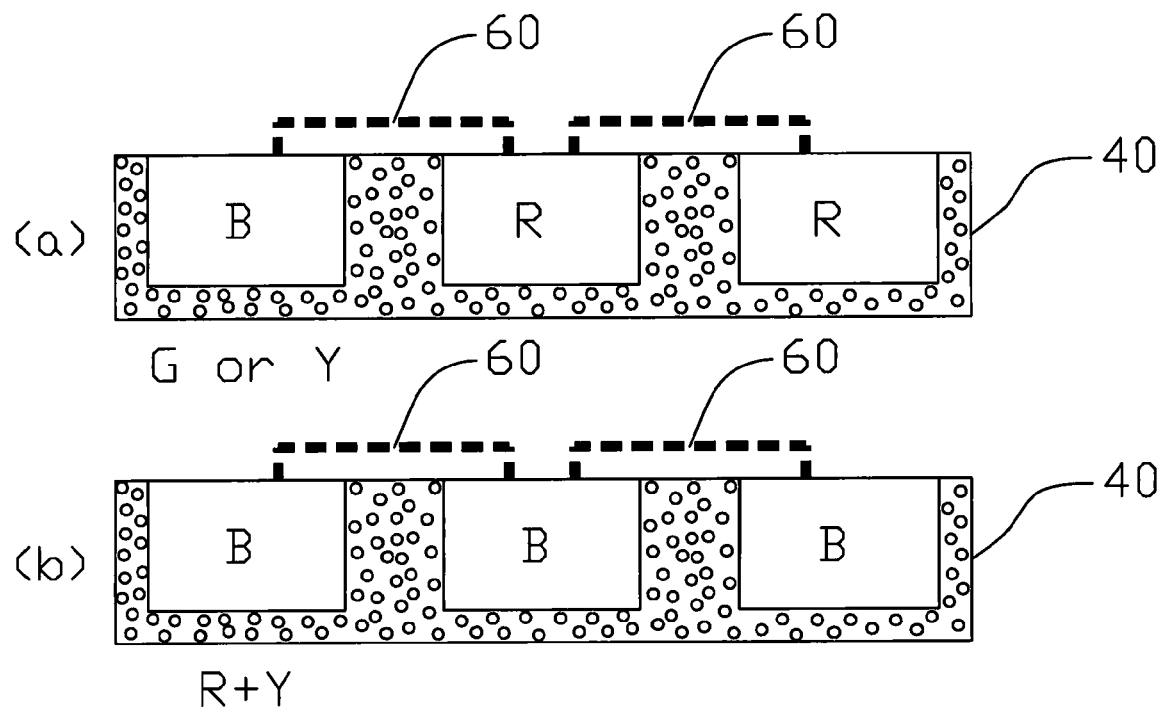
FIG. 17 illustrates a deployment of a wave conversion material in an optoelectronic system in accordance with further embodiment of the present invention.

As shown in FIG. 17(*a*), a part or a number of the system units in the light-emitting system or the sub-group emit blue light, while the other part or a number of the system units emit red light. The material 40 is mixed with red or yellow phosphor, preferably, the quantity of the blue light system unit is less than that of the red light system unit. For example, the quantity ratio of blue light system unit to the red light system unit is N/1+N (N belongs to a positive integer). Or the power ratio of the blue light system unit to the red light system unit is N1/N2 (N1 and N2 N belong to positive integers). Preferably, the blue light system unit has a greater power than the red light system unit. For example, N1/N2=3.0/1.0, 2.5/1.0, 2.0/1.0, 1.5/1.0, or 1.1/1.0. As shown in FIG. 17(*b*), the system unit 30 of the light-emitting system, and/or the sub-group emits blue light, and the material 40 is mixed with red and yellow phosphor. Preferably, the red and yellow phosphor powders are uniformly distributed in a predetermined space of the material 40. However, the powders may be also distributed in a random, gradient, dispersed, or staggered configuration.

Figure 18:
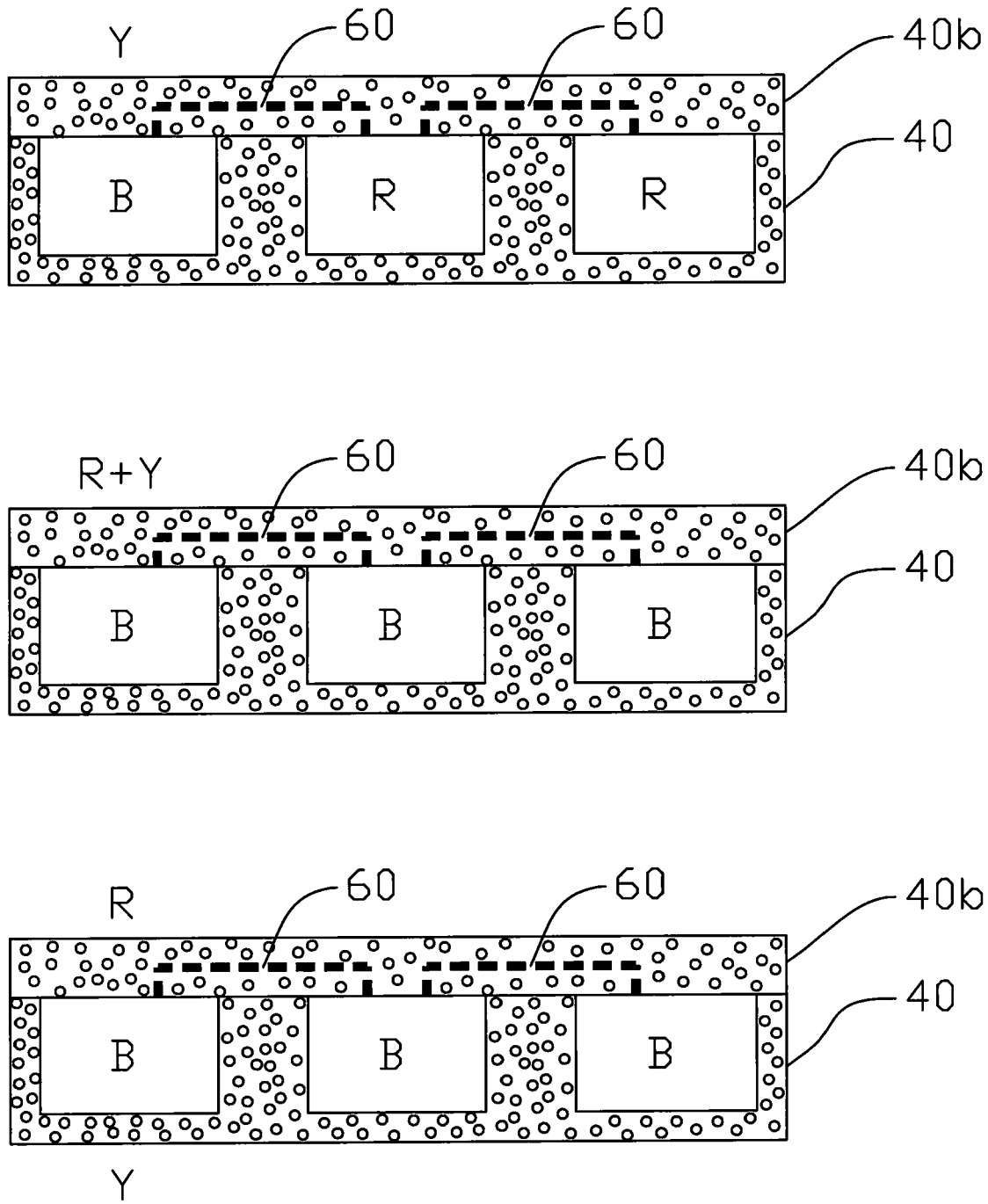
FIG. 18 illustrates a deployment of a wave conversion material in an optoelectronic system in accordance with one embodiment of the present invention.

As shown in FIG. 18(*a*), a part of the system units in the light-emitting system or the sub-group emit blue light, while the other part emit red light. The materials 40 and 40*b* are mixed with yellow phosphors having identical or different emitting spectrums. As shown in FIG. 18(*b*), the effective or active system unit of the light-emitting system or sub-group emit blue light; while the materials 40 and 40*b* are mixed with red and yellow phosphor at a proper ratio. In FIG. 18(*c*), the effective or active system unit of the light-emitting system or sub-group emit blue light, while the material 40 is mixed with yellow phosphor powder, and the material 40 is mixed with yellow phosphor powder, the material 40b is mixed with the red phosphor powder.

Figure 19:
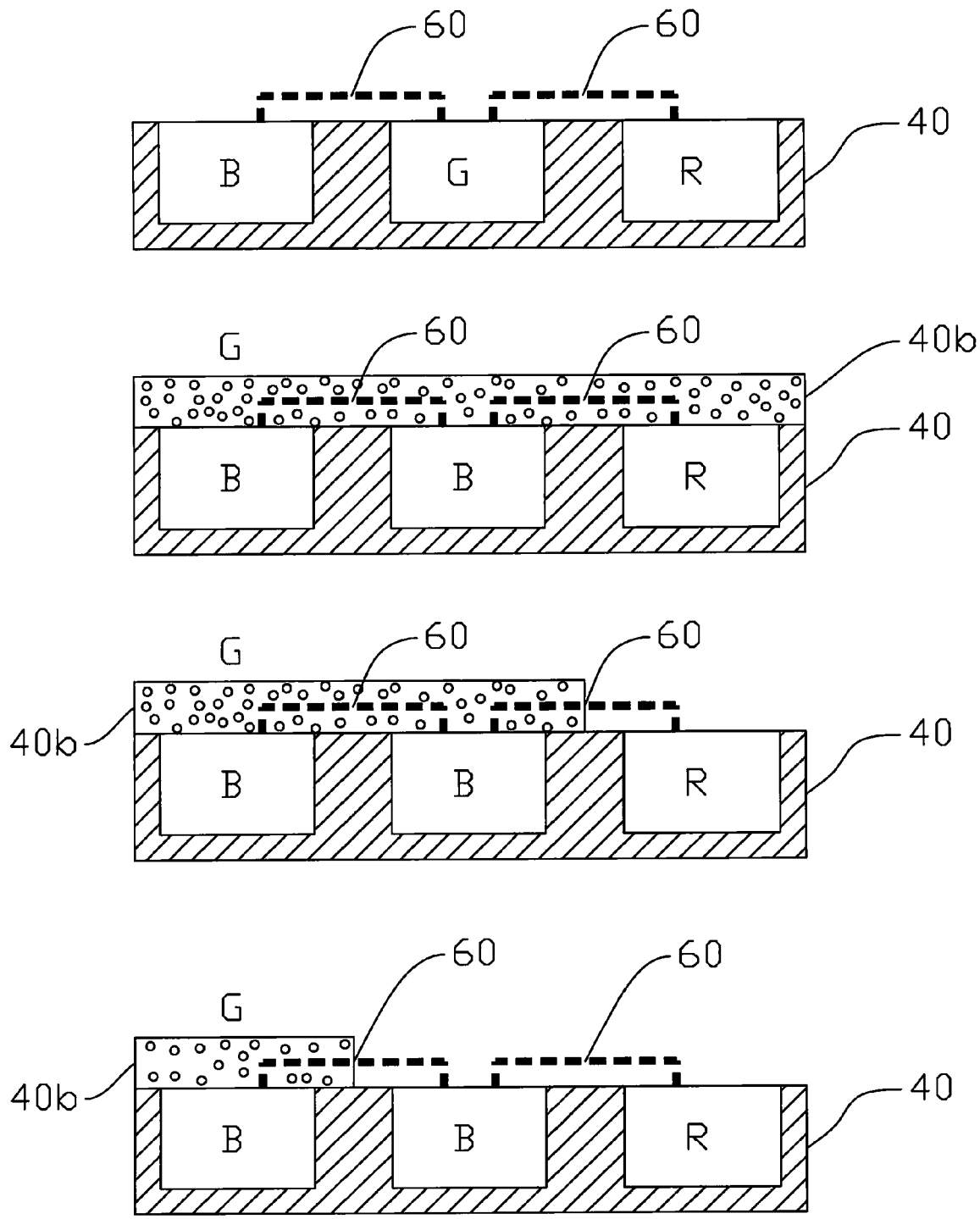
FIG. 19 illustrates a deployment of a wave conversion material in an optoelectronic system in accordance with another embodiment of the present invention.

As shown in FIG. 19(a), a part of the system units in the light-emitting system or the sub-group emit blue light, while a part of the system units emit red light; a part of the system units emit green light. As shown in FIG. 19(b), a part of the system units in the light-emitting system or the sub-group emit blue light, while the other part emit red light. The material 40 is arranged on the two parts of the system units and mixed with green phosphor powder. As shown in FIG. 19(c), a part of the system units in the light-emitting system or the sub-group emit blue light, while the other part emit red light. The material 40 is arranged on the blue light system units and mixed with green phosphor powder. As shown in FIG. 19(d), a part of the system units in the light-emitting system or the sub-group emit blue light, while the other part emit red light. The material 40 is arranged on a part or local area of the blue light system units and mixed with green phosphor powder.

Figure 20:
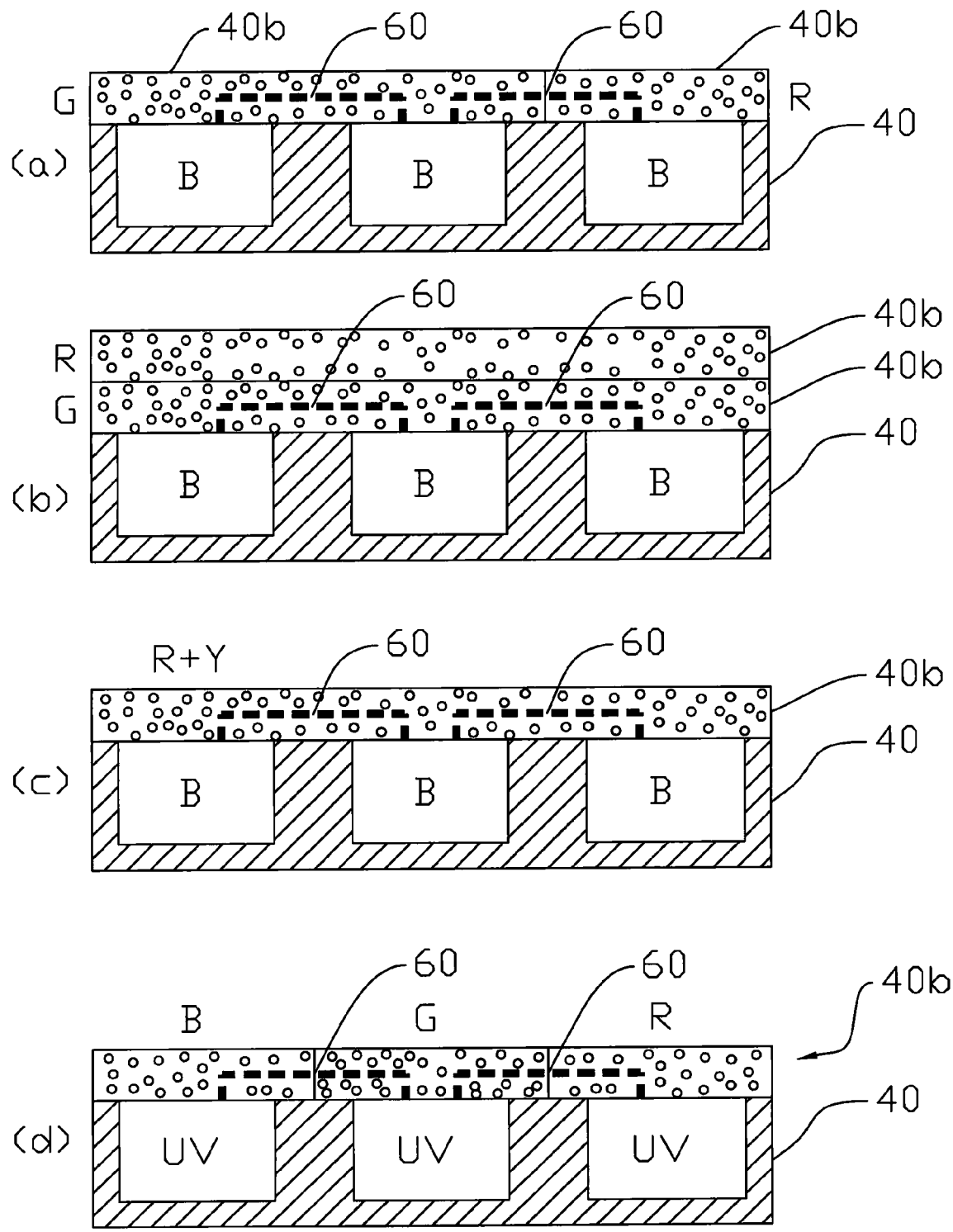
FIG. 20 illustrates deployments of wave conversion materials in an optoelectronic system in accordance with further embodiment of the present invention.

As shown in FIGS. 20(a)~20(c), the effective or active system unit in the light-emitting system or sub-group emit blue light. In FIG. 20(a), an area of the material 40b is mixed with green phosphor powder; another area of the material 40b is mixed with red phosphor powder. Preferably, the area of green phosphor powder is greater than that of red phosphor powder. In FIG. 20(b), an area of the material 40b is mixed with green phosphor powder; another area of the material 40b is mixed with red phosphor powder. The two areas are overlapped with each other. Preferably, the area emitting shorter wavelength is closer to the system unit than the area emitting longer wave length. In FIG. 20(c), the material 40b is mixed with red and yellow phosphor powder. In FIG. 20(d), the effective or active system units in the light-emitting system or sub-group emit invisible radiation, such as UV light. The materials 40b respectively mixed with blue, green, and red phosphor powder are arranged on the system unit. The areas of the tree parts can be adjusted according to the efficiency, decay, and/or thickness of the phosphor powders.

In above-mentioned or following embodiments, cool white light can be formed by mixture of the blue light and suitable yellow light; warm white light can be formed by the mixture of blue light and suitable yellow light and red light. The power ratio of blue light to red light is about 2:1~5:1, for example, 2.5:1, 3:1, 3.5:1, 4:1, and 4.5:1. The power ratio of green light to yellow light is about 1:4. However, the scale and the arrangement of the materials 40 and 40b in the drawing are only for illustration, but not to limit the embodiment of the present invention. In addition, the material 40, the material 40b, or both can further cover the system unit which the phosphor powder is not disposed in the light path thereof. The material 40 and/or the material 40b may be integrated with phosphor bulk, sintered bulk, ceramic bulk, dye, or the combination thereof.

Figure 21:
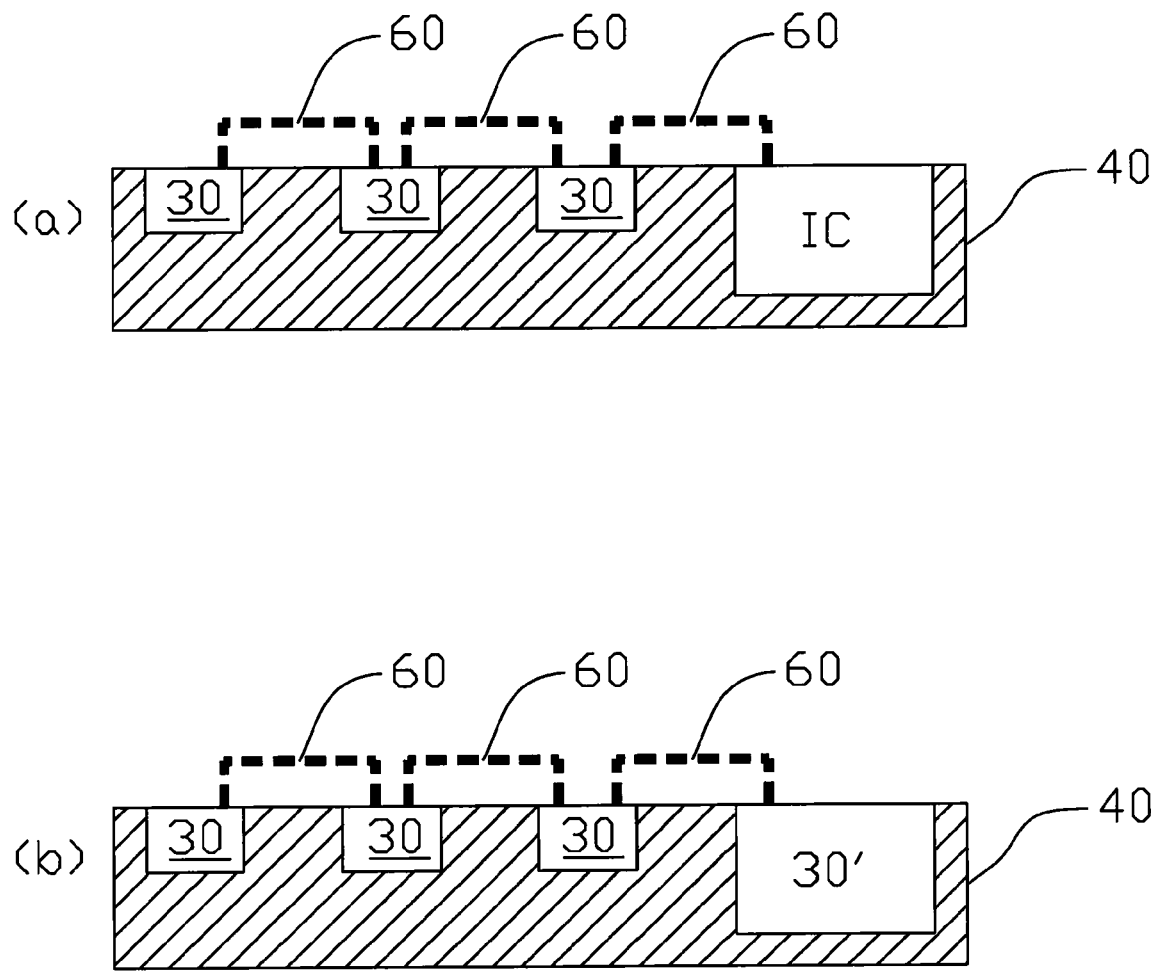
FIG. 21 illustrates deployments of system units in an optoelectronic system in accordance with further embodiment of the present invention.
Figure 22:
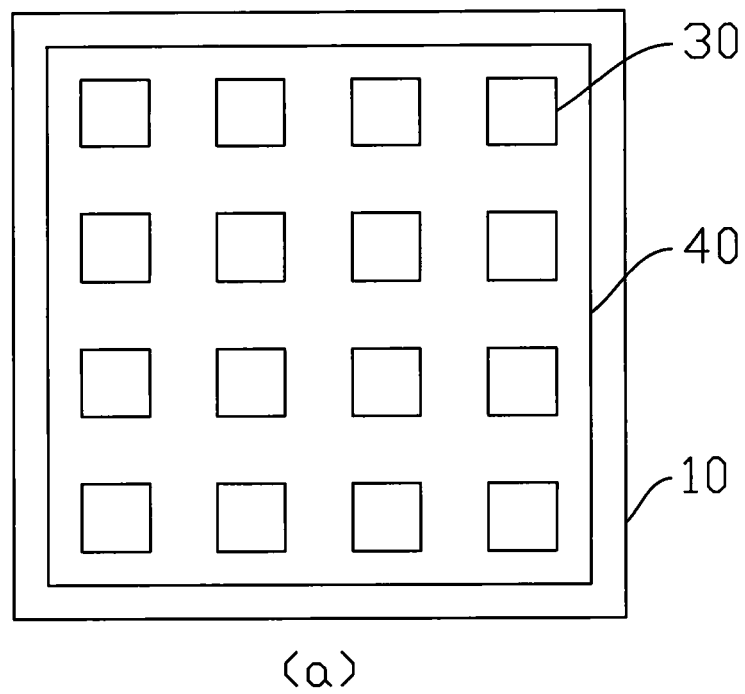
FIG. 22 illustrates deployments of optoelectronic elements or system units in an optoelectronic system in accordance with one embodiment of the present invention.
Figure 22:
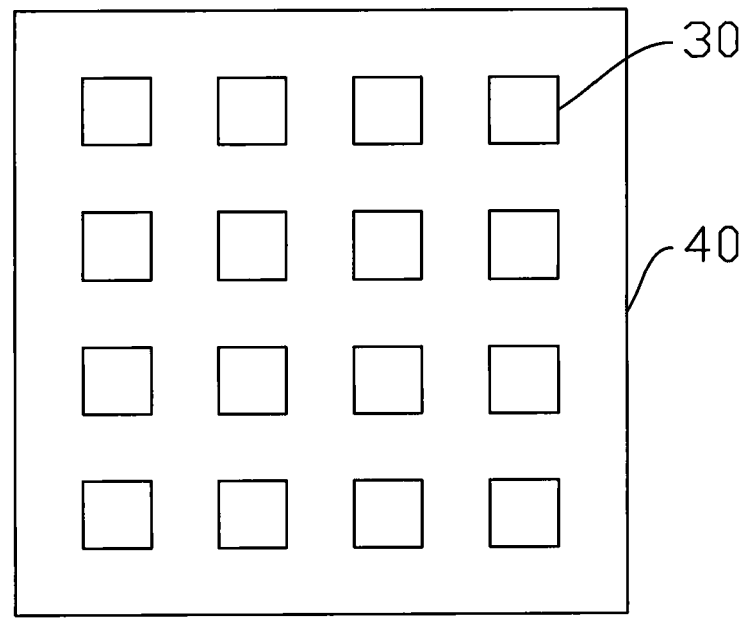
Figure 22:
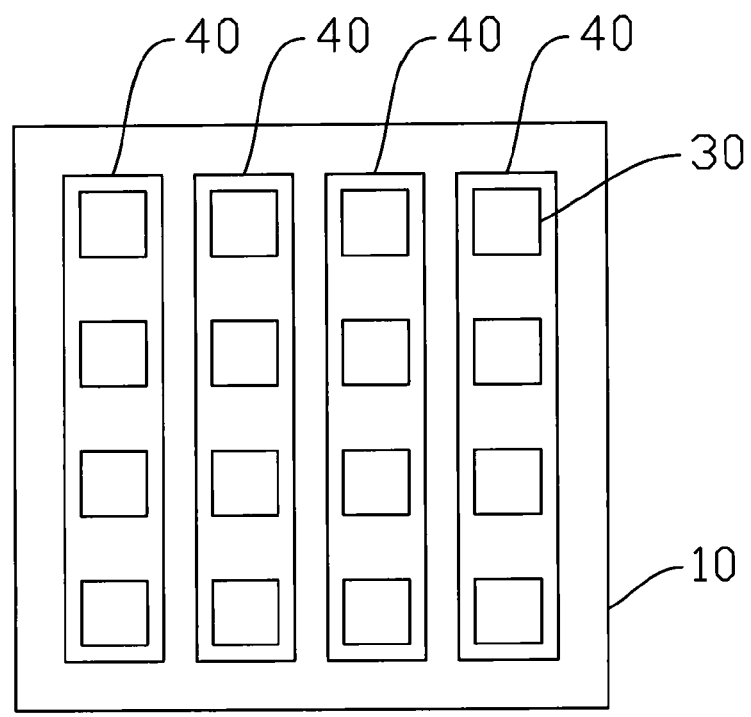
Figure 22:
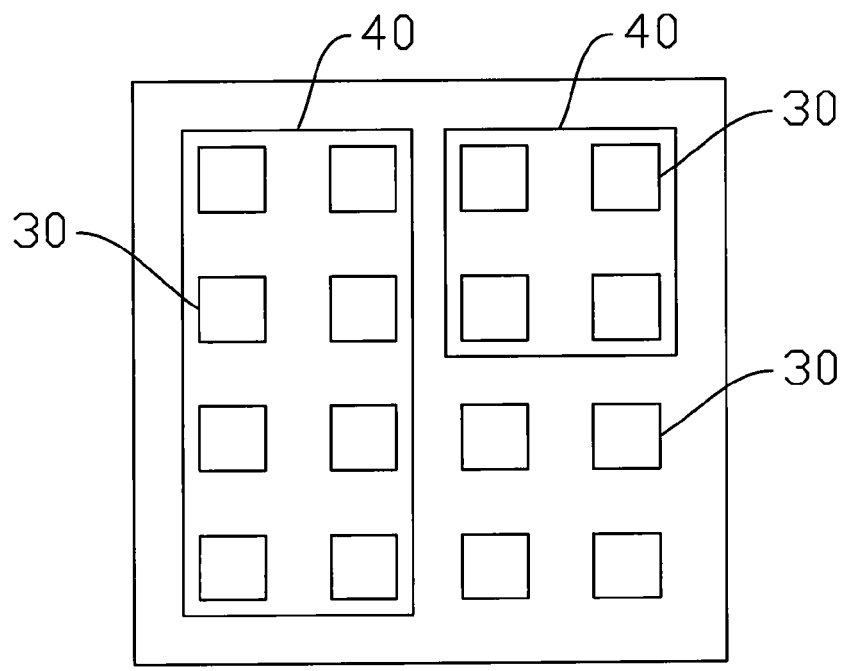
Figure 22:
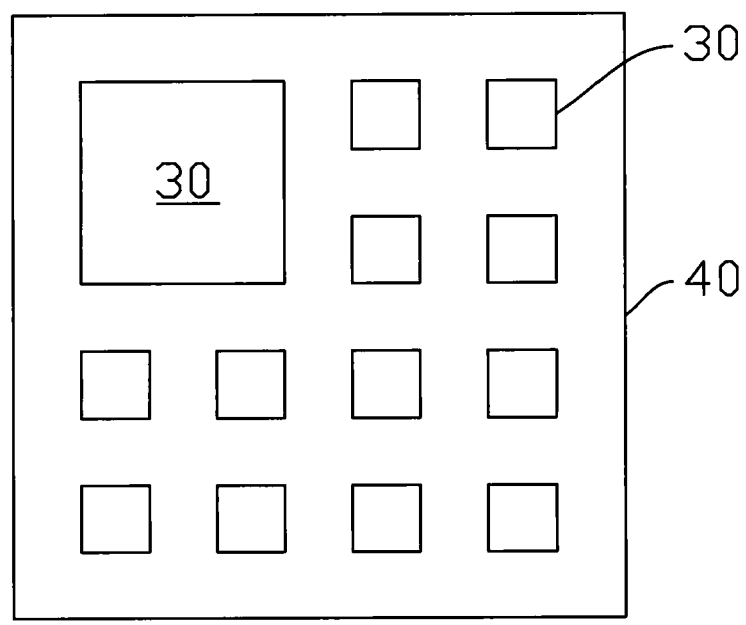
Figure 22:
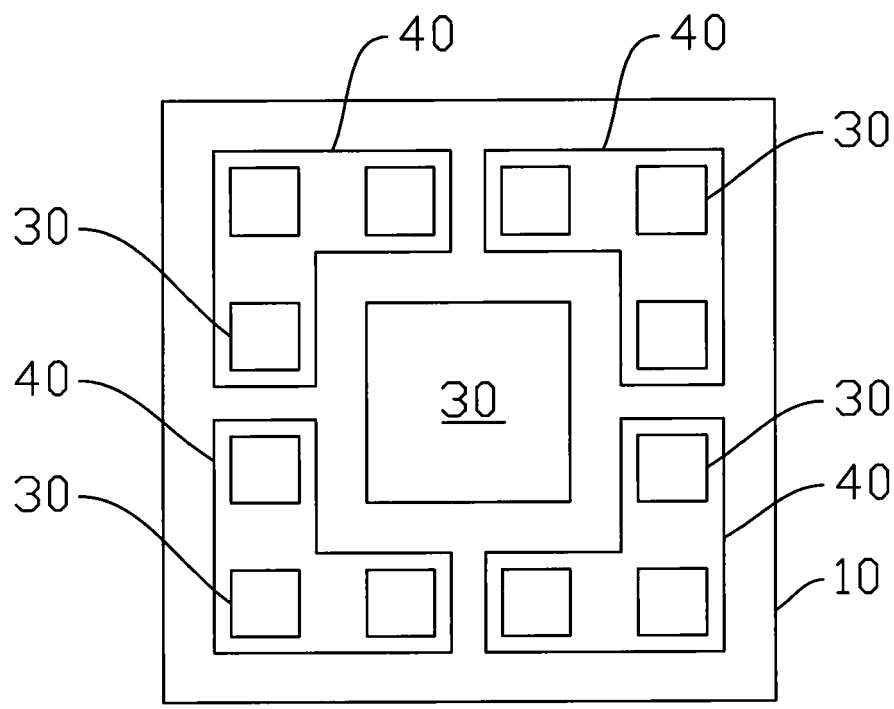

Furthermore, the optoelectronic system or sub-group includes not only system unit 30 which emits light but also one or more ICs which can be used to control the a part or whole of the system unit 30 or as a rely circuit of a part or whole of the system unit 30, as shown in FIG. 21(a). In addition to the ICs, the optoelectronic system or sub-group can be further connected to a system unit 30'. In one embodiment, the system unit 30' is a power supply system, such as chemical battery, solar cell, and fuel cell. In another embodiment, the system unit 30' is a transformer, a frequency conversion system, and a regulator. Specifically, the system unit 30' is a SWMP (Switched Mode Power Supply), and/or high frequency transformer.

FIGS. 22(a)~22(f) illustrate the configurations of optoelectronic system or sub-group. Wherein, the system unit 30 is not limited to one emits light but can be one does not emit light.

Figure 23A:
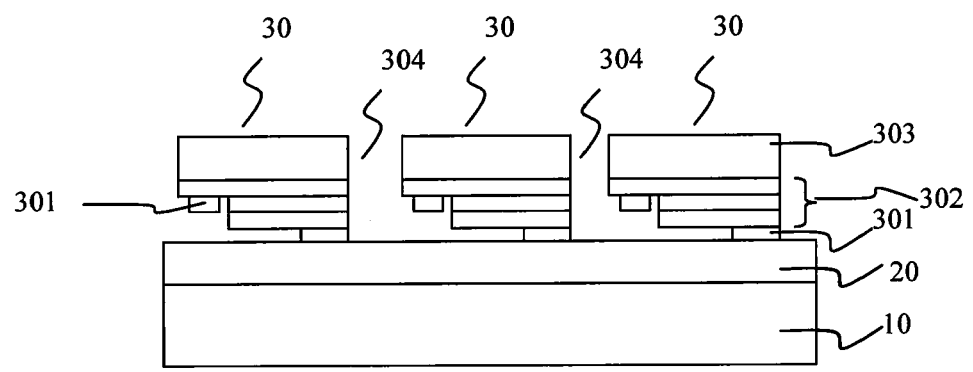
FIGS. 23A~23E illustrate steps of manufacturing a structure in accordance with an embodiment of the present invention.

As shown in FIG. 23A, a method of making the optoelectronic system in accordance with one embodiment of the present invention is disclosed. Firstly, a carrier 10 (also called "temporary substrate" in present embodiment) is provided. A layer or structure 20 (also called "first connecting layer"), which has adhesive upper and lower surfaces, is formed on the temporary substrate 10 by spin coating, vapor deposition, or printing. Two or more unpackaged system units 30 (also called "optoelectronic element") are placed on and connected to the first connecting layer 20 by a pick & place system. A number of trenches 304 are formed between the optoelectronic elements 30. The precision of placing the optoelectronic elements 30 is governed by the pick & place system, for example, the tolerance is not greater than 15 μm. The optoelectronic element is a light-emitting diode in the embodiment. The structure of the light-emitting diode includes a substrate 303, a semiconductor epitaxial layer 302 formed on the substrate 303, and at least one electrode 301. The semiconductor epitaxial layer 302 includes a first conductivity semiconductor layer, an active layer, and a second conductivity semiconductor layer. Furthermore, the substrate 303 can be optionally removed during the manufacturing process in order to reduce the size of system. In one preferable embodiment, at least one electrode 301 of the optoelectronic element 30 is connected to the first connecting layer 20. The optoelectronic elements 30 may emit lights having the same or different wave length ranged from UV to infrared.

The material of the temporary substrate 10 is can be silicone, glass, quartz, ceramic, alloy, or PCB. The material of the first connecting layer 20 can be thermal release tape, UV release tape, chemical release tape, heat resistant tape, and blue tape. The material of the substrate 303 can be sapphire, SiC, ZnO, GaN, or Si, glass, quartz, or ceramic. The first conductivity semiconductor layer, the active layer, and the second conductivity semiconductor layer may include at least one element selected from the group consisting of Ga, Al, In, As, P, N, and Si.

Figure 23B:
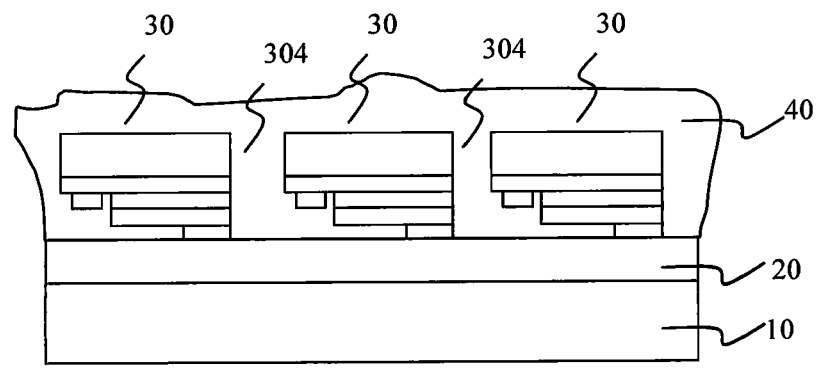

As shown in FIG. 23B, a material 40 (also called "adhesive glue") is further provided to fill the trenches 304 between the optoelectronic elements 30, and cover the optoelectronic element 30 and the surface of the first connecting layer not covered by the optoelectronic element. The adhesive glue 40 is formed by spin coating, printing, or molding. The adhesive glue 40 may be a elastic material, such as silicone rubber, silicone resin, elastic PU, porous PU, acrylic rubber, or chip cutting glue, such as blue tape or UV glue. In present embodiment, a polish process can be further introduced to smooth the surface of the optoelectronic element 30 and prevent the overflow or sink of the adhesive glue 40.

Figure 23C:
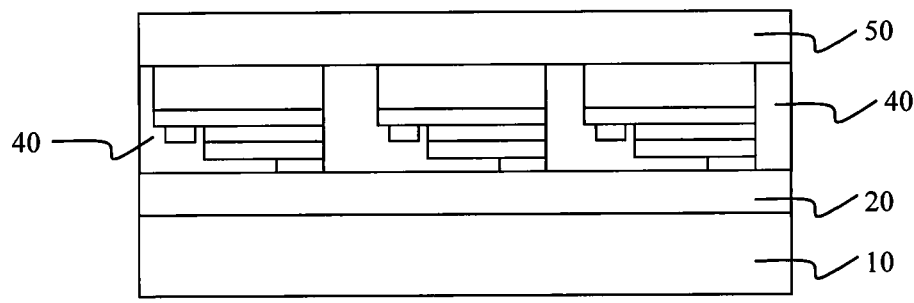

As shown in FIG. 23C, a sub-carrier 50 (also called "permanent substrate") is provided to bond with optoelectronic elements 30 where the adhesive glue 40 is applied. The bonding process can be a hot pressing process. In a preferable embodiment, the permanent substrate 50 is directly connected to the substrate 303 of the optoelectronic element 30. The material of the permanent substrate 50 can be chosen from silicone, glass, quartz, alloy, or PCB.

Figure 23D:
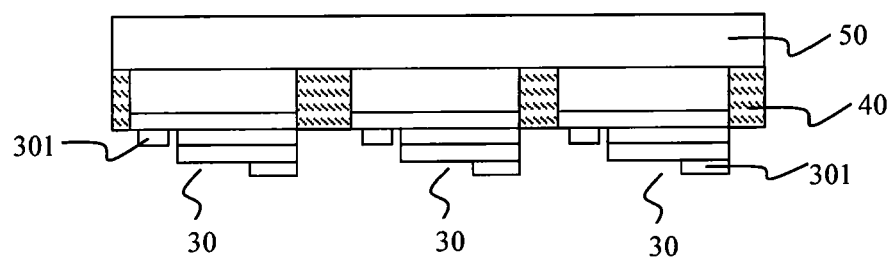

As shown in FIG. 23D, the temporary substrate 10, the first connecting layer 20, and part of the adhesive glue 40 are removed by laser lift-off, heating, and/or dissolving the pattern film. The electrode 301 of the optoelectronic elements 30 and part of the semiconductor epitaxial layer 302 are exposed.

Figure 23E:
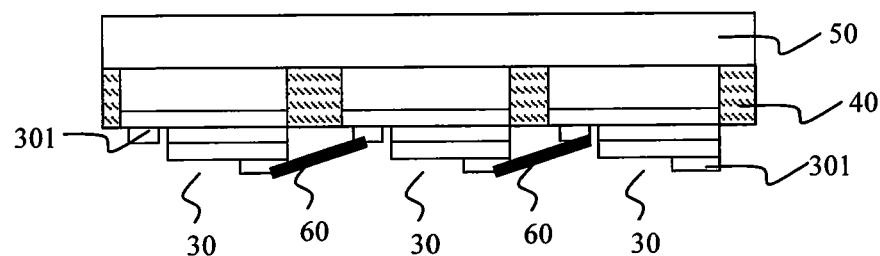

As shown in FIG. 23E, the optoelectronic elements 30 are coupled together in a series connection by forming electrical connections 60 (specifically, are wires in present embodiment) which are formed by lithography, and/or wire bonding. The material of wire 60 can be Au, Al, or alloy thereof. The structure of the electrical connection 60 can be a single layer or multi-layer. Finally, an optoelectronic system is formed.

Figure 24A:
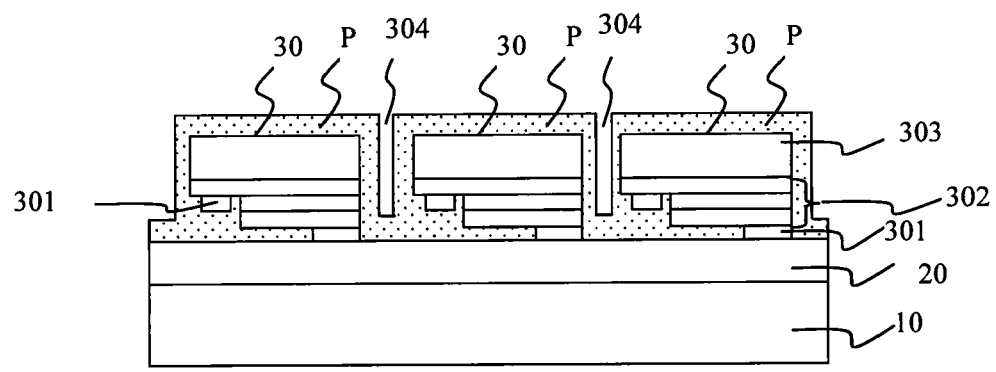
FIGS. 24A~24G illustrate steps of manufacturing a structure in accordance with another embodiment of the present invention.

FIGS. 24A~24G illustrate a workflow in accordance with another embodiment of the present invention. As shown in FIG. 24A, a temporary substrate 10 is provided. A first connecting layer 20, which has adhesive upper and lower surfaces, is formed on the temporary substrate 10 by spin coating, vapor deposition, or printing. Two or more unpackaged optoelectronic element 30 are placed on and connected to the first connecting layer 20 by a pick & place system. A number of trenches 304 are formed between the optoelectronic elements 30. The precision of placing the optoelectronic elements 30 is governed by the pick & place system, for example, the tolerance is not greater than 15 μm. Wherein, the optoelectronic element is such as a light-emitting diode including a substrate 303, a semiconductor epitaxial layer 302 formed on the substrate 303, and at least one electrode 301. The semiconductor epitaxial layer 302 includes a first conductivity semiconductor layer, an active layer, and a second conductivity semiconductor layer. In one preferable embodiment, at least one electrode 301 of the optoelectronic element 30 is connected to the first connecting layer 20. The optoelectronic elements 30 may emit lights having the same or different wave lengths ranged from UV to infrared.

The material of the temporary substrate 10 can be silicone, glass, quartz, ceramic, alloy, or PCB. The material of the first connecting layer 20 can be thermal release tape, UV release tape, chemical release tape, heat resistant tape, and blue tape. The material of the substrate 303 can be sapphire, SiC, ZnO, GaN, or Si, glass, quartz, or ceramic. The first conductivity semiconductor layer, the active layer, and the second conductivity semiconductor layer may include at least one element selected from the group consisting of Ga, Al, In, As, P, N, and Si.

In addition, as shown in FIG. 24A, a phosphor material P can be formed on the optoelectronic element 30. A uniform phosphor material is better for providing stable white light and reducing the divergence of the white lights from the optoelectronic elements 30. The phosphor material P can be formed by spin coating, depositing, dropping, scraping, or molding. In another embodiment, each of the optoelectronic elements 30 is covered by different phosphor material. In further embodiment, the optoelectronic elements 30 are optionally covered by different phosphor materials to blend into various color light, i.e. not all of the optoelectronic elements are covered by the phosphor material. For example, three of the optoelectronic elements, which are blue light-emitting diodes, are grouped together. The first one is covered by red phosphor; the second one is covered by green phosphor; the third one is not covered by any phosphor. The mixture of blue light, red light, and green light brings out white light.

Figure 24B:
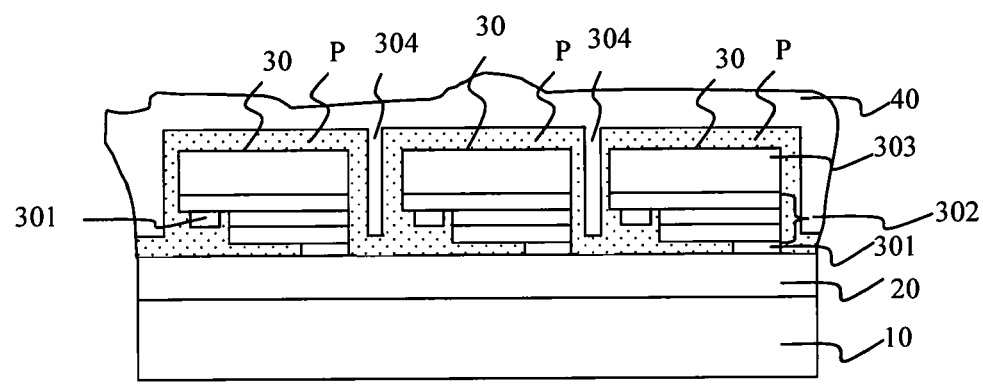

As shown in FIG. 24B, an adhesive glue 40 is further provided to fill the trenches 304 between the optoelectronic elements 30, and cover the optoelectronic element 30 and the surface of the first connecting layer 20 not covered by the optoelectronic element 30. The adhesive glue 40 is formed by spin coating, printing, or molding. The adhesive glue 40 may be an elastic material, such as silicone rubber, silicone resin, elastic PU, porous PU, acrylic rubber, or chip cutting glue, such as blue tape or UV glue. In present embodiment, a polish process can be further introduced to smooth the surface of the optoelectronic element 30 and prevent the overflow or sink of the adhesive glue 40.

Figure 24C:
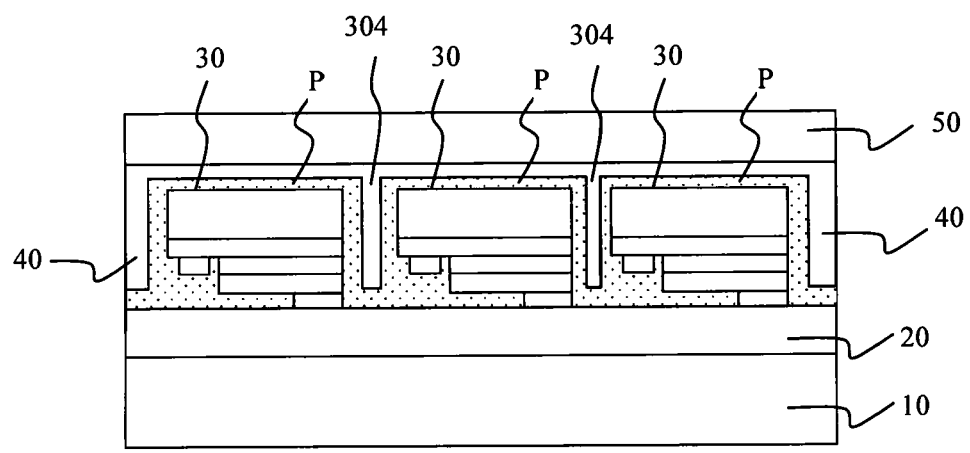

As shown in FIG. 24C, a permanent substrate 50 is provided to bond with optoelectronic elements 30 where the adhesive glue 40 is applied. The bonding process can be a hot pressing process. In a preferable embodiment, the permanent substrate 50 is directly connected to the substrate 303 of the optoelectronic element 30.

The material of the permanent substrate 50 can be chosen from silicone, glass, quartz, alloy, or PCB.

Figure 24D:
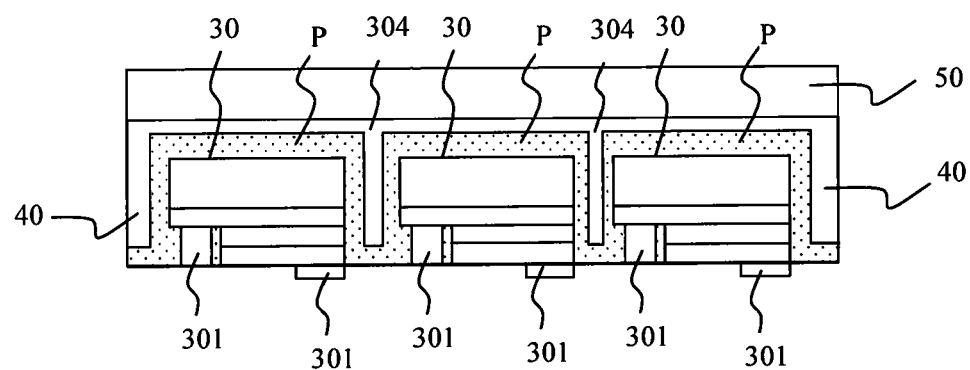

As shown in FIG. 24D, the temporary substrate 10, the first connecting layer 20, and part of the adhesive glue 40 are removed by laser lift-off, heating, and/or dissolving the pattern film. The electrode 301 of the optoelectronic elements 30 and part of the semiconductor epitaxial layer 302 are exposed.

Figure 24E:
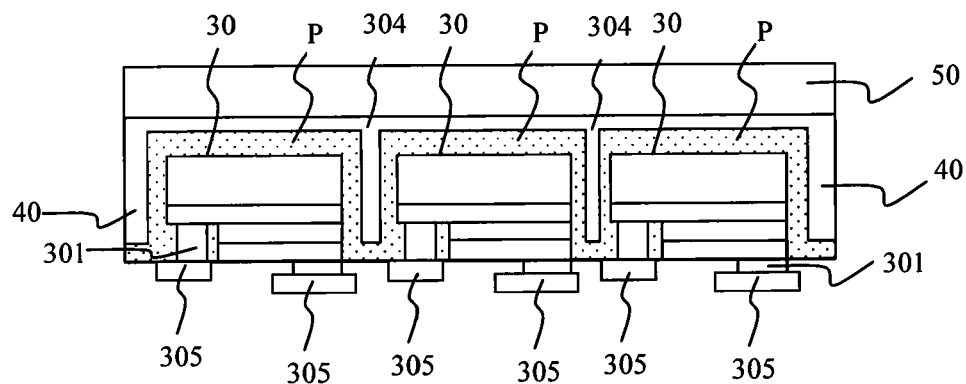

As shown in FIG. 24E, a number of fan-out electrodes 305 are formed on electrodes 301 of the optoelectronic element 30 by electroplating or vapor deposition. The area of the fan-out electrode 305 is greater than that of the electrode 301, and the positioning tolerance for following packaging process is therefore increased. The fan-out electrode 305, which has bigger area, is beneficial to conduct heat to the package substrate such as metal or PCB. The material of the fan-out electrode 305 is such as Au, Al, or alloy or multi metallic structure.

Figure 24F:
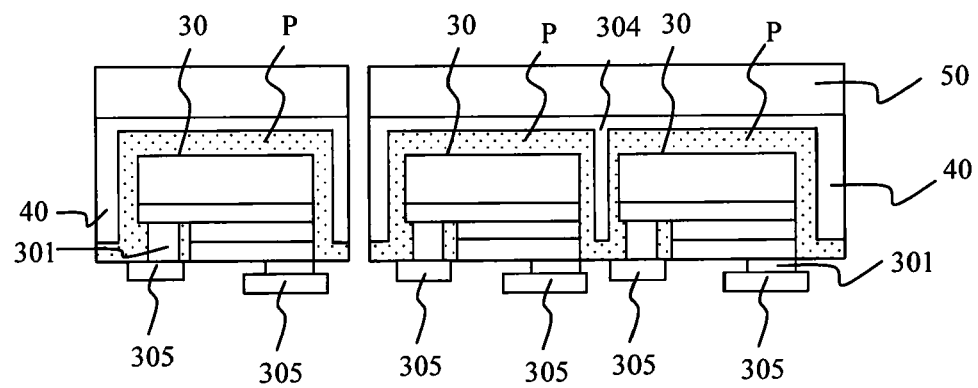
Figure 24G:
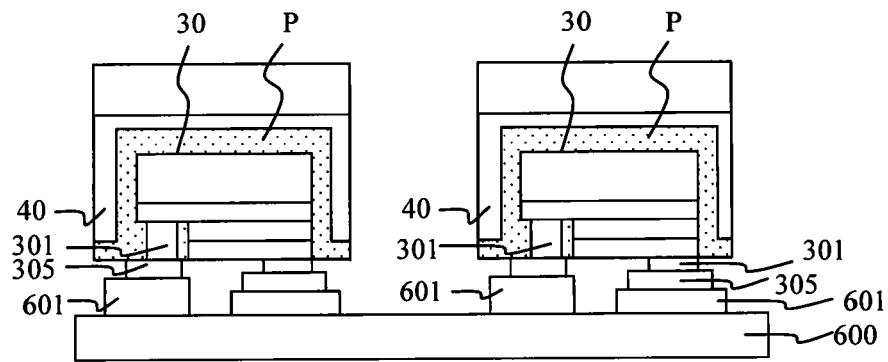

As shown in FIGS. 24F~24G, the optoelectronic elements 30 are divided into chips. To form an optoelectronic system, each chip can be boned to a sub-mount 600 by solder 601. The sub-mount 600 is such as a lead frame or large scale mounting substrate for facilitating the circuit layout of the optoelectronic system and heat dissipation.

Moreover, the embodiments of FIGS. 23 and 24 can be referred to or combined with each other. For example, the optoelectronic element 30 of FIG. 23 can be optionally covered by phosphor material, or the step of FIG. 23D can be followed by the step of FIG. 24E in order to introduce the steps of making the fan-out electrode and dividing into chips. Similarly, the step of FIG. 24D can be followed by the step of FIG. 23E in order to couple the optoelectronic elements by wires.

Figure 25A:
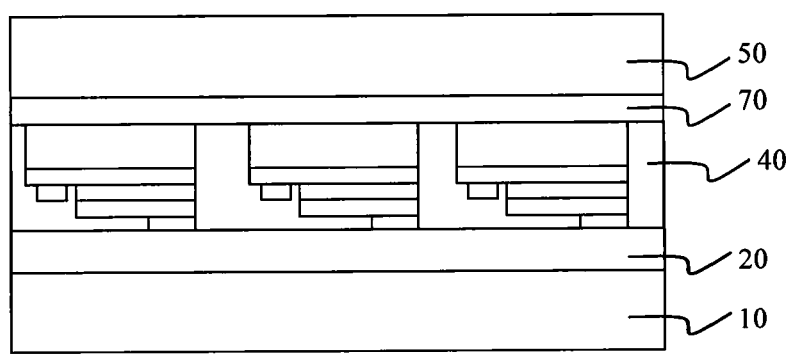
FIGS. 25A and 25B illustrate structures in accordance with one embodiment of the present invention.
Figure 25B:
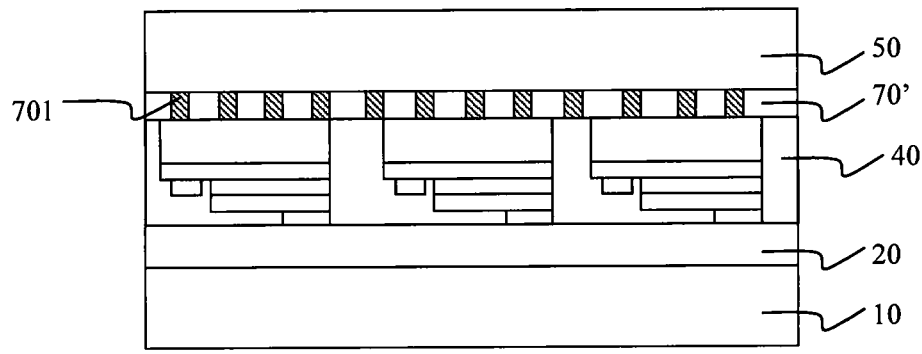

Furthermore, in another embodiment of the present invention as shown in FIG. 25A, a permanent substrate 50 is firstly provided to connect with a second connecting layer 70 and then bonded to the optoelectronic elements 30 covered by the adhesive glue 40 by hot press process. The material of the second connecting layer 70 is such as $SiO_x$, $SiN_x$, and silicone. In further embodiment of the present invention, which can be introduced after FIG. 23B or FIG. 24B, as shown in FIG. 25B, the second connecting layer 70' further includes channels 701 which is beneficial to increase the heat dissipation and power wattage of the optoelectronic system. The channels 701 are made by metallic material, such as Cu, Al, Ni, or the alloy thereof. However, the channels 701 and the second connecting layer 70' may be made by the same material, such as sapphire, metal, and SiN.

Figure 26:
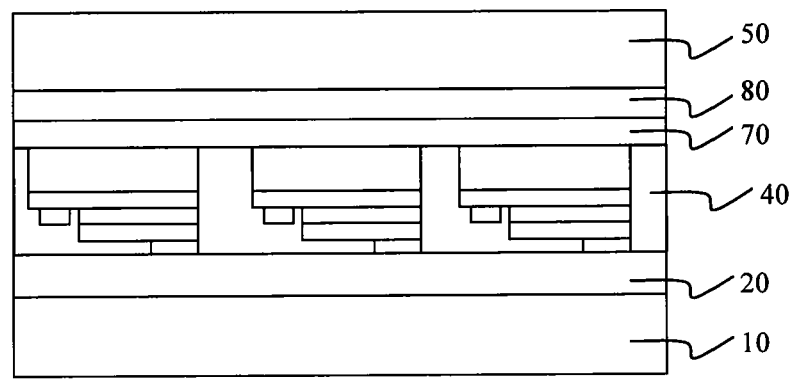
FIG. 26 illustrates a structure in accordance with an embodiment of the present invention.

In one embodiment of the present invention, which can be introduced after FIG. 23B or FIG. 24B, as shown in FIG. 26, a permanent substrate 50, which is connected with a first reflecting layer 80 by an inter-layer (not shown), is provided to connect with a second connecting layer 70 and then bond to the optoelectronic elements 30 with the adhesive glue 40 by hot pressing process. The material of the inter-layer is such as $SiO_x$, $SiN_x$, and silicone. The first reflecting layer 80 is made by metallic material, such as Ag, Al, or Pt, or a distributed Bragg reflector (DBR) which is composed of dielectric materials or semiconductors. In present embodiment, the use of the first reflecting layer 80 is beneficial to increase the light extraction of the optoelectronic system.

Figure 27:
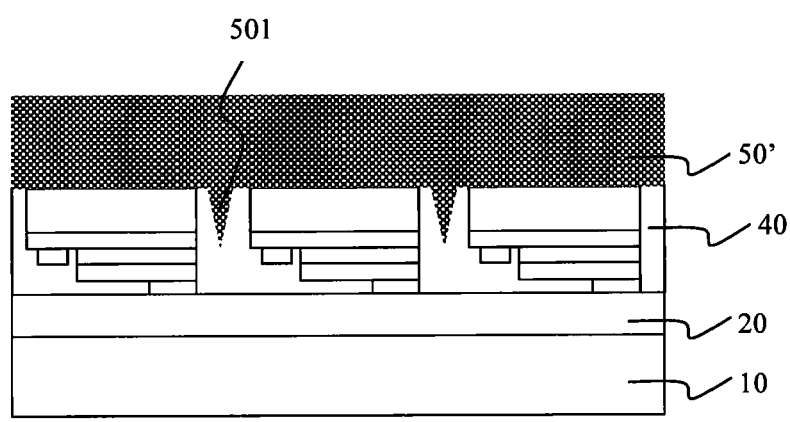
FIG. 27 illustrates a structure in accordance with another embodiment of the present invention.

In further embodiment of the present invention, which is introduced after FIG. 23B or FIG. 24B, as shown in FIG. 27, a substrate 50' having a micro-pyramid array is provided to prevent side-emitting loss and/or poor light extraction due to the closeness of the optoelectronic elements 30. The substrate 50' with micro-pyramid array can be made by etching the semiconductor. The shape of the micro-pyramid 501 is such as cone, triangular pyramid, and tetra pyramid. The base angle of the micro-pyramid 501 is between 20~70 degree. In another embodiment, a second reflecting layer with a higher refraction index can be formed on the surface of the substrate 50'. The substrate 50' can be made by silicone, glass, quartz, ceramic, alloy, or PCB. If the substrate 50' is made by a good conductive material, such as Cu, Al, Ceramic, and Si, the reliability of the optoelectronic element can be further improved. The substrate 50' is aligned with the optoelectronic elements 30 by hot pressing process. In present embodiment, the use of the substrate 50' with the micro-pyramid array is beneficial to increase the light extraction by turning the side-emitting light toward the vertical direction.

The foregoing description has been directed to the specific embodiments of this invention. It will be apparent; however, that other alternatives and modifications may be made to the embodiments without escaping the spirit and scope of the invention.

What is claimed is:

1. A method of making an optoelectronic system comprising:
    providing a temporary substrate;
    providing un-packaged optoelectronic elements having sidewalls, top surfaces, and bottom surfaces, at least one of the unpackaged optoelectronic elements having an electrode provided on a side of the bottom surfaces;
    attaching the bottom surfaces to the temporary substrate such that a trench is formed between two of the un-packaged optoelectronic elements;
    providing an adhesive material to fully fill the trench and cover the un-packaged. optoelectronic elements such that the sidewalls and top surfaces of the un-packaged optoelectronic elements are fully enclosed by the adhesive material;
    providing a transparent substrate on the adhesive material; and
    removing the temporary substrate without removing all the adhesive material covering the optoelectronic elements.

2. The method of claim 1 further comprising: providing a first connecting layer on the temporary substrate to connect the un-packaged optoelectronic elements.

3. The method of claim 1, wherein the un-packaged optoelectronic elements comprises a. light-emitting diode.

4. The method of claim 1 further comprising: providing a phosphor layer on at least one of the top surfaces of the un-packaged optoelectronics elements.

5. The method of claim 1 further comprising: providing a fan-out electrode on an electrode of one of the un-packaged optoelectronic elements, wherein the fan-out electrode is wider than the electrode.

6. The method of claim 1 further comprising: providing a fan-out electrode electrically connected to at least one of the un-packaged optoelectronic elements and extending outside a boundary of the at least one of the un-packaged optoelectronic elements.

7. The method of claim 1 further comprising: providing a second connecting layer between the transparent substrate and at least one of the un-packaged optoelectronic elements.

8. The method of claim 7, wherein the second connecting layer comprises a channel.

9. The method of claim 1 further comprising: providing a micro-pyramid between two of the un-packaged optoelectronic elements.

10. The method of claim 1, wherein at least one of the top surfaces is devoid of a metal layer.

11. The method of claim 1, wherein the attaching step comprises preparing the un-packaged optoelectronic elements which have a growth substrate covered by the adhesive material.

12. The method of claim 1, wherein, in the step of attaching the bottom surface to the temporary substrate, the electrode is directly attached to the temporary substrate.

13. The method of claim 12, wherein the electrode has an elevation higher than the adhesive material.

14. The method of claim 1, further comprising electrically coupling the optoelectronic elements in series, in parallel, or both.

15. The method of claim 1, wherein the electrode is exposed after removing the temporary substrate.

16. The method of claim 1, wherein the adhesive material is attached to the side walls of the un-packaged optoelectronic elements after removing the temporary substrate.

17. The method of claim 1, further comprising a step of dividing the transparent substrate after removing the temporary substrate.

18. The method of claim 1, further comprising a step of providing a reflecting layer on the transparent substrate.

19. The method of claim 1 further comprising: providing a phosphor powder mixed with the adhesive layer.

\* \* \* \* \*